US011435667B2

(12) United States Patent
Jung et al.

(10) Patent No.: US 11,435,667 B2
(45) Date of Patent: Sep. 6, 2022

(54) POLYMER FOR ORGANIC BOTTOM ANTI-REFLECTIVE COATING AND BOTTOM ANTI-REFLECTIVE COATINGS COMPRISING THE SAME

(71) Applicants: SK Innovation Co., Ltd., Seoul (KR); SK Global Chemical Co., Ltd., Seoul (KR)

(72) Inventors: Minho Jung, Daejeon (KR); Cheolwoo Kim, Daejeon (KR); Jinsu Ham, Daejeon (KR); Sunjoo Kim, Daejeon (KR); Myung Jun Park, Daejeon (KR); Namkyu Lee, Daejeon (KR); Hyesoo Lee, Daejeon (KR)

(73) Assignees: SK Innovation Co., Ltd., Seoul (KR); SK Global Chemical Co., Ltd., Seoul (KR)

( * ) Notice: Subject to any disclaimer, the term of this patent is extended or adjusted under 35 U.S.C. 154(b) by 459 days.

(21) Appl. No.: 16/634,564

(22) PCT Filed: Jul. 4, 2018

(86) PCT No.: PCT/KR2018/007583
§ 371 (c)(1),
(2) Date: Jan. 27, 2020

(87) PCT Pub. No.: WO2019/022404
PCT Pub. Date: Jan. 31, 2019

(65) Prior Publication Data
US 2020/0264509 A1    Aug. 20, 2020

(30) Foreign Application Priority Data

Jul. 26, 2017  (KR) .................. 10-2017-0094614

(51) Int. Cl.
*G03F 7/09*      (2006.01)
*C08G 18/02*    (2006.01)
(Continued)

(52) U.S. Cl.
CPC .......... *G03F 7/091* (2013.01); *C08G 18/022* (2013.01); *C09D 5/006* (2013.01); *C09D 179/04* (2013.01); *G03F 7/11* (2013.01); *H01L 21/0276* (2013.01)

(58) Field of Classification Search
CPC .......... G03F 7/11; G03F 7/091; C08G 59/40; C08G 73/0655; C08G 18/022
See application file for complete search history.

(56) References Cited

U.S. PATENT DOCUMENTS 7,425,399 B2    9/2008  Kishioka et al.
7,794,919 B2 *  9/2010  Kishioka ................. G03F 7/091
                                                              430/311
(Continued)

FOREIGN PATENT DOCUMENTS

KR         100872674 B1    12/2008
KR       1020100125196 A    11/2010
(Continued)

*Primary Examiner* — Amanda C. Walke
(74) *Attorney, Agent, or Firm* — The Webb Law Firm

(57) ABSTRACT

Provided are a polymer for an organic bottom anti-reflective coating and a bottom anti-reflective coating composition containing the same. More specifically, provided are a polymer for an organic bottom anti-reflective coating capable of relieving reflection of exposure light and irradiation light on a substrate of a photoresist layer applied on the substrate in a lithographic process of manufacturing a semiconductor device, and a bottom anti-reflective coating composition containing the same.

10 Claims, 1 Drawing Sheet

(51) Int. Cl.
  *C09D 5/00* (2006.01)
  *C09D 179/04* (2006.01)
  *H01L 21/027* (2006.01)
  *G03F 7/11* (2006.01)

(56) References Cited

U.S. PATENT DOCUMENTS

| | | | |
|---|---|---|---|
| 8,221,965 B2 | 1/2012 | Yao et al. | |
| 9,873,799 B2* | 1/2018 | Hamakubo | C08K 9/06 |
| 11,048,169 B2* | 6/2021 | Park | G03F 7/094 |
| 2006/0290429 A1* | 12/2006 | Kishioka | G03F 7/038 |
| | | | 430/311 |
| 2010/0092894 A1 | 4/2010 | Liu et al. | |
| 2011/0200938 A1* | 8/2011 | Yao | G03F 7/091 |
| | | | 430/324 |
| 2016/0032109 A1* | 2/2016 | Hamakubo | C09D 4/00 |
| | | | 428/522 |
| 2017/0199459 A1* | 7/2017 | Ryu | H01L 28/00 |
| 2019/0129305 A1* | 5/2019 | Lee | G03F 7/0392 |
| 2019/0129307 A1* | 5/2019 | Kwon | C09D 161/30 |
| 2019/0377262 A1* | 12/2019 | Bae | C08L 63/00 |
| 2020/0285153 A1* | 9/2020 | Park | C08G 18/791 |
| 2021/0271168 A1* | 9/2021 | Endo | C08G 59/26 |

FOREIGN PATENT DOCUMENTS

| | | | | |
|---|---|---|---|---|
| KR | 101026127 B1 | | 4/2011 | |
| KR | 1020110083635 A | | 7/2011 | |
| KR | 101216402 B1 | | 12/2012 | |
| KR | 101429326 B1 | | 8/2014 | |
| KR | 20170014120 A | * | 8/2015 | ........... C07D 405/14 |
| KR | 101590608 B1 | * | 2/2016 | ........... C07D 251/32 |
| KR | 101590608 B1 | | 2/2016 | |
| WO | WO-2013161862 A1 | * | 10/2013 | ........... C08F 220/10 |

* cited by examiner

POLYMER FOR ORGANIC BOTTOM ANTI-REFLECTIVE COATING AND BOTTOM ANTI-REFLECTIVE COATINGS COMPRISING THE SAME

CROSS-REFERENCE TO RELATED APPLICATIONS

This application is the United States national phase of International Application No. PCT/KR2018/007583 filed Jul. 4, 2018, and claims priority to Korean Patent Application No. 10-2017-0094614 filed Jul. 26, 2017, the disclosures of which are hereby incorporated by reference in their entirety.

TECHNICAL FIELD

The following disclosure relates to a polymer for an organic bottom anti-reflective coating, and a bottom anti-reflective coating composition containing the same. More specifically, the following disclosure relates to a polymer for an organic bottom anti-reflective coating capable of relieving reflection of exposure light and irradiation light on a substrate of a photoresist layer applied on the substrate in a lithographic process of manufacturing a semiconductor device, and a bottom anti-reflective coating composition containing the same.

BACKGROUND ART

In recent years, resolution of photoresist used in a lithography process has become an important critical factor in order to miniaturize the lithography process due to continuous high integration of a large scale integrated circuit (LSI), particularly, in order to perform an ultrafine pattern process below 30 nm node. Accordingly, exposure light wavelength is further shortened in the conventional g-line or i-line region, and thus research on lithography using far ultraviolet ray, KrF excimer laser, or ArF excimer laser has attracted attention.

However, when the wavelength of an exposure light source is shortened, a light interference effect due to a reflective light which is reflected on a layer to be etched of a semiconductor substrate is increased, pattern profile becomes poor due to undercutting, notching, or the like, or size uniformity is lowered. In order to prevent the above-described problems, bottom anti-reflective coatings (BARCs) for absorbing exposure light (reflective light) are usually formed between the layer to be etched and the photoresist film.

The bottom anti-reflective coating is divided into an inorganic bottom anti-reflective coating and an organic bottom anti-reflective coating depending on the kind of material used. The inorganic bottom anti-reflective coating is used by optimizing reflectance, and the organic bottom anti-reflective coating absorbs light passing through a photoresist film.

The inorganic bottom anti-reflective coating has good conformality with respect to the bottom step, but is not easy to remove in a subsequent process and has a problem in that a footing phenomenon in which patterns float frequently occurs. Thus, in recent years, the organic bottom anti-reflective coating has been widely used.

In general, the organic bottom anti-reflective coating has advantages that a vacuum evaporation apparatus, a chemical vapor deposition (CVD) apparatus, a sputtering apparatus, or the like, for film formation is required, absorption property with respect to radiation is excellent, and an etch rate in a dry etching process for photoresist is relatively good as compared to the inorganic bottom anti-reflective coating.

Therefore, in order to reduce the reflectance as much as possible, the technique of placing an organic anti-reflective coating containing absorbable organic molecules under the photoresist to control the reflectance, thereby preventing reflection of an underlayer film has become important.

Further, there is also a need for a composition for an underlayer film having optical properties with respect to radiation having a shorter wavelength such as 157 nm, 193 nm, 248 nm, or the like.

Technical Problem

An embodiment of the present invention is directed to providing a polymer for an organic bottom anti-reflective coating which prevents reflection of an underlayer film, and to providing a polymer for an organic bottom anti-reflective coating capable of having high etch selection property and minimizing reflectivity between a resist layer and an underlayer material.

Another embodiment of the present invention is directed to providing a polymer for an organic bottom anti-reflective coating capable of having a high etching rate and an excellent etch selectivity and forming a good pattern shape.

Still another embodiment of the present invention is directed to providing a polymer for an organic bottom anti-reflective coating having optical characteristics with respect to radiation having a shorter wavelength such as 157 nm, 193 nm, 248 nm, or the like.

Still another embodiment of the present invention is directed to providing a bottom anti-reflective coating composition containing the polymer for an organic bottom anti-reflective coating.

TECHNICAL SOLUTION

Figure 1:
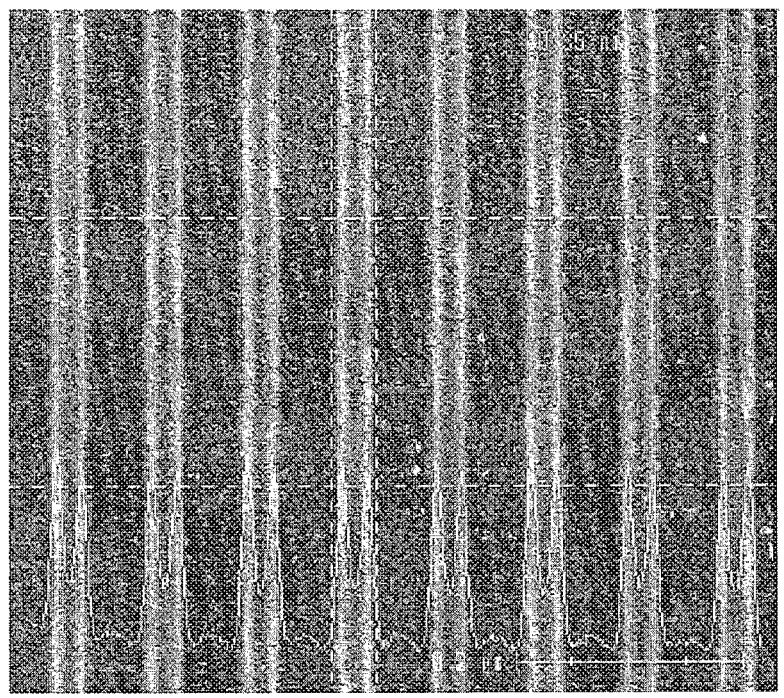
FIG. 1 shows a resist pattern formed by using a composition 10.

In one general aspect, there is provided a polymer for an organic bottom anti-reflective coating including one or more chemical structures selected from Chemical Formulas 1-1, 1-2, and 1-3 below and one or more chemical structures selected from Chemical Formulas 2-1, 2-2, and 2-3 below:

[Chemical Formula 1-1]

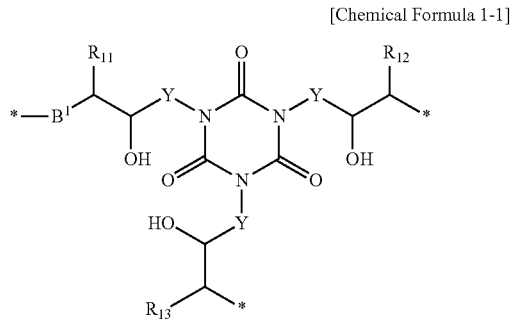

[Chemical Formula 1-2]

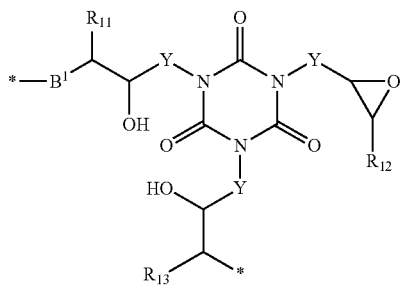

[Chemical Formula 1-3]

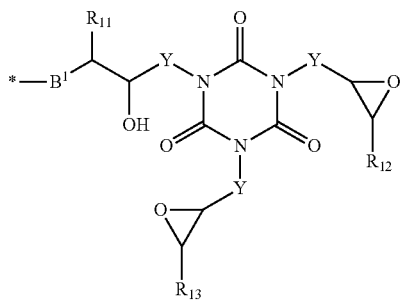

[Chemical Formula 2-1]

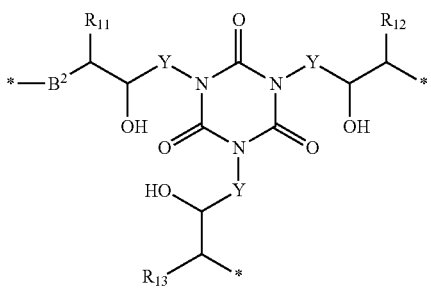

[Chemical Formula 2-2]

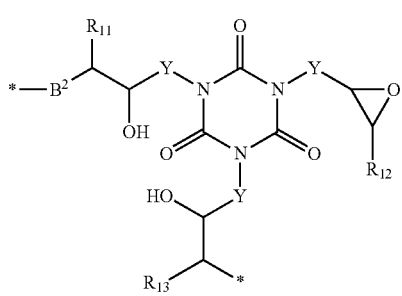

[Chemical Formula 2-3]

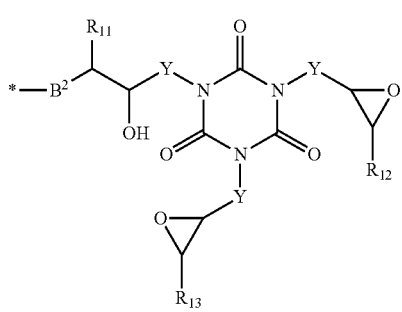

in Chemical Formulas 1-1, 1-2, 1-3, 2-1, 2-2 and 2-3, Y is a divalent linking group, and $R_{11}$, $R_{12}$, and $R_{13}$ are each selected from hydrogen and C1-C10 alkyl, and each of $B^1$ and $B^2$ is selected from Chemical Formula 3 below and has a different chemical structure,

[Chemical Formula 3]

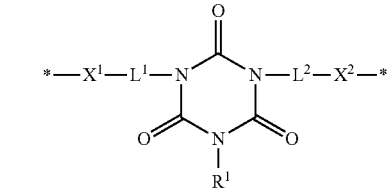

in Chemical Formula 3, $R^1$ is selected from hydrogen, C1-C40 hydrocarbyl, substituted C1-C40 hydrocarbyl, C1-C40 heterohydrocarbyl, and substituted C1-C40 heterohydrocarbyl, $X^1$ and $X^2$ are each independently selected from —O—, —COO—, —NR—, and —S—, and R is selected from hydrogen and C1-C10 alkyl, and $L^1$ and $L^2$ are each independently selected from C1-C10 alkylene, C2-C15 alkenylene, C3-C10 cycloalkylene, and C6-C20 arylene.

The polymer for an organic bottom anti-reflective coating may further include: any one or two or more chemical structures selected from Chemical Formulas 4 and 5 below:

[Chemical Formula 4]

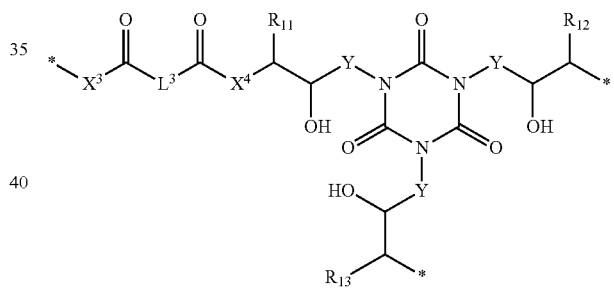

in Chemical Formula 4, Y is a divalent linking group, $R_{11}$, $R_{12}$, and $R_{13}$ are each selected from hydrogen and C1-C10 alkyl, $X^3$ and $X^4$ are each independently selected from —O—, —COO—, —NR—, and —S—, and R is selected from hydrogen and C1-C10 alkyl, and $L^3$ is selected from a direct bond, C1-C40 hydrocarbylene, and C1-C40 heterohydrocarbylene,

[Chemical Formula 5]

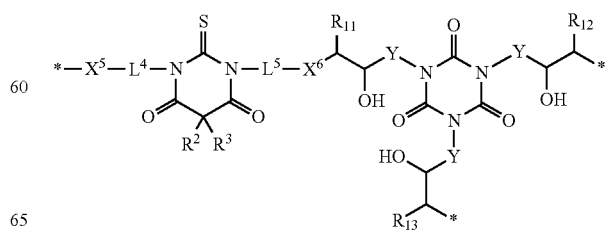

in Chemical Formula 5, Y is a divalent linking group, $R_{11}$, $R_{12}$, and $R_{13}$ are each selected from hydrogen and C1-C10 alkyl, $R^2$ and $R^3$ are each independently selected from hydrogen, halogen, nitro, cyano, hydroxy, C1-C40 hydrocarbyl, substituted C1-C40 hydrocarbyl, C1-C40 heterohydrocarbyl, and substituted C1-C40 heterohydrocarbyl, or $R^2$ and $R^3$ may be an alicyclic ring linked via C1-C40 hydrocarbylene with or without a hetero atom, $X^5$ and $X^6$ are each independently selected from —O—, —COO—, —NR—, and —S—, and R is selected from hydrogen and C1-C10 alkyl, and $L^4$ and $L^5$ are each independently selected from C1-C10 alkylene, C2-C15 alkenylene, C3-C10 cycloalkylene, and C6-C20 arylene.

The polymer for an organic bottom anti-reflective coating may have a weight average molecular weight of 1,000 to 30,000 g/mol.

In Chemical Formulas 1-1, 1-2, 1-3, 2-1, 2-2, and 2-3 above, Y may be C1-C10 alkylene, $R_{11}$, $R_{12}$, and $R_{13}$ may be hydrogen, each of $B^1$ and $B^2$ may be selected from Chemical Formula 3 above and may have a different chemical structure, in Chemical Formula 3 above, $R^1$ may be C1-C20 alkyl or C3-C10 cycloalkyl C1-C10 alkyl, $X^1$ and $X^2$ may be each independently —COO—, and $L^1$ and $L^2$ may be each independently C1-C10 alkylene.

$B^1$ may be a chemical structure in which $R^1$ in Chemical Formula 3 is C1-C4 alkyl, and $B^2$ may be a chemical structure in which $R^1$ in Chemical Formula 3 is C6-C14 alkyl or C3-C5 cycloalkyl C1-C10 alkyl.

In Chemical Formula 4, Y may be C1-C10 alkylene, $R_{11}$, $R_{12}$ and $R_{13}$ may be hydrogen, $X^3$ and $X^4$ may be —COO—, and $L^3$ may be C1-C10 alkylene.

In Chemical Formula 5, Y may be C1-C10 alkylene, $R_{11}$, $R_{12}$ and $R_{13}$ may be hydrogen, $R^2$ and $R^3$ may be each independently C1-C15 alkyl, $X^5$ and $X^6$ may be —COO—, $L^4$ and $L^5$ may be each independently C1-C10 alkylene.

In another general aspect, there is provided a bottom anti-reflective coating composition containing the polymer for an organic bottom anti-reflective coating as described above.

The bottom anti-reflective coating composition may include to 50 wt % of the polymer and 50 to 99 wt % of an organic solvent.

The bottom anti-reflective coating composition may further include any one or two or more additive(s) selected from an acid, an acid generator, a cross-linking agent, a defoaming agent, a light absorber, a curing agent and a surfactant.

In another general aspect, there is provided a bottom anti-reflective coating formed by applying the bottom anti-reflective coating composition and having a contact angle of 60 degrees or more, a refractive index n of 1.91 to 2.0 at a wavelength of 193 nm, and an extinction coefficient k of 0.20 to 0.30.

Advantageous Effects

The polymer for an organic bottom anti-reflective coating according to the present invention may form an organic bottom anti-reflective coating having a high etching rate and an excellent etch rate.

In addition, when the organic bottom anti-reflective coating is formed using the bottom anti-reflective coating composition containing the polymer for an organic bottom anti-reflective coating according to the present invention, it is possible to implement a high dry etching rate while preventing reflection of an underlayer film in an ultrafine pattern forming process using a 193 nm light source, which is useful for ultrafine patterning of semiconductors.

DETAILED DESCRIPTION OF EMBODIMENTS

Hereinafter, the present invention is described in detail through specific embodiments or Examples including the accompanying drawings. Meanwhile, the following exemplary embodiments and examples are provided as a reference for explaining the present invention in detail, and therefore, the present invention is not limited thereto, but may be implemented in various ways.

Unless defined otherwise, all technical and scientific terms used herein have the same meanings generally understood by those skilled in the art to which the present invention pertains. Terms used in the specification of the present invention are used merely for the purpose of effectively describing specific exemplary embodiments, but are not intended to limit the present invention.

It is intended that singular forms used in the appended specification and claims include plural forms unless otherwise indicated in the context.

The term "hydrocarbyl" in the present invention refers to a radical having one binding site derived from hydrocarbon, and specifically for example, may be selected from alkyl, cycloalkyl, aryl, alkenyl, alkynyl, or the like, or may be a combination thereof. Term "hydrocarbylene" refers to a hydrocarbon divalent radical having two binding sites derived from hydrocarbon.

The term "substituted hydrocarbyl or substituted heterohydrocarbyl" used in the present invention refers to a structural skeleton of a group or a moiety, further substituted with any one or two or more substitutes selected from halogen including fluoro (F), chloro (Cl), bromo (Br) or iodo (I) radical, or the like, hydroxyl, amino, oxo (=O), thio (=S), and the like.

The term "heterohydrocarbyl" used in the present invention refers to a heterohydrocarbon radical including a carbon atom and one or more atoms selected from one or more hetero atoms B, N (including —N=), O, S, Si, P(=O) and P.

In the present invention, substituents including "alkyl", "alkoxy", "alkylene" and other "alkyl" moieties include both linear and branched forms, and for example, C1-C20 alkyl means alkyl having 1 to 20 carbon atoms.

Terms "cycloalkyl" and "cycloalkylene" in the present invention means non-aromatic monocyclic or multicyclic ring system, preferably having 3 to 10 carbon atoms. A monocyclic ring includes, but is not limited to, cyclopropyl, cyclobutyl, cyclopentyl, and cyclohexyl. Examples of a multicyclic cycloalkyl group include perhydronaphthyl, perhydroindenyl, and the like; and examples of a bridged multicyclic cycloalkyl group include adamantyl, norbornyl, and the like.

Term "aryl" in the present invention, which is an organic radical derived from aromatic hydrocarbon due to removal of one hydrogen, includes a single ring system or a fused ring system including 4 to 7 ring atoms, preferably, 5 or 6 ring atoms in each ring, and even includes a form in which a plurality of aryls are connected by a single bond. Specific examples of the aryl include phenyl, naphthyl, biphenyl, anthryl, indenyl, fluorenyl, and the like, but the present invention is not limited thereto.

Terms "alkenyl" and "alkenylene" in the present invention refer to linear or branched chain hydrocarbon radical containing at least one carbon to carbon double bond. In one example, the alkenyl radical is a lower alkenyl radical having 2 to 10, preferably 2 to about 7 carbon atoms. The most preferable lower alkenyl radical is a radical having 2 to about 5 carbon atoms. In addition, the alkenyl group may be substituted at any available binding point. Examples of the alkenyl radical include ethenyl, propenyl, butenyl, and the like. Terms "alkenyl" and "lower alkenyl" include radicals having cis and trans orientations, or alternatively, E and Z orientations.

"Alicyclic ring" in the present invention means a non-aromatic monocyclic or multicyclic ring system, wherein the carbon in the ring may have a carbon-carbon double bond or a carbon-carbon triple bond. The alicyclic ring preferably has 3 to 10 carbon atoms.

Hereinafter, the present invention is described in detail.

The present inventors found that, when at least two or more different chemical structures selected from Chemical Formula 3 below are included at a position of B in a polymer including a structural unit represented by Chemical Formula 1 below, it was possible to form an ultrafine pattern having a high etching rate, an excellent etch rate, and a good pattern shape which are desirable at the time of forming an organic bottom anti-reflective coating, and completed the present invention. In other words, the present inventors found that when at least two or more different chemical structures selected from the chemical structure represented by Chemical Formula 3 below were included as compared to a polymer in which chemical structures at the position of B are all the same, it was possible to implement more improved etching rate, etch rate, and high dry etching rate while preventing reflection with respect to radiation having a shorter wavelength such as 157 nm, 193 nm, 248 nm, or the like, and completed the present invention.

Here, the "different chemical structure" refers to a case where a substituent type or the number of carbon atoms of any one of $R^1$, $X^1$, $X^2$, $L^1$ and $L^2$ in the following Chemical Formula 3 below is different, or more preferably a case where the substituent types of $R^1$ are different from each other or the number of carbon atoms of $R^1$ may be different while having the same kind of substituent.

[Chemical Formula 1]

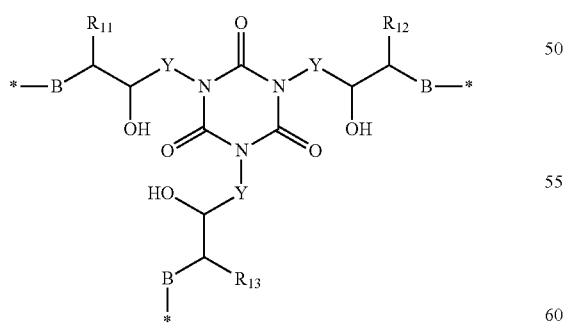

in Chemical Formula 1, Y is a divalent linking group, $R_{11}$, $R_{12}$, and $R_{13}$ are each selected from hydrogen and C1-C10 alkyl, B is two or more different chemical structures selected from Chemical Formula 3 below:

[Chemical Formula 3]

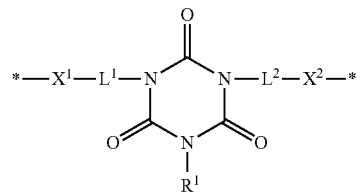

in Chemical Formula 3, $R^1$ is selected from hydrogen, C1-C40 hydrocarbyl, substituted C1-C40 hydrocarbyl, C1-C40 heterohydrocarbyl, and substituted C1-C40 heterohydrocarbyl, $X^1$ and $X^2$ are each independently selected from —O—, —COO—, —NR—, and —S—, and R is selected from hydrogen and C1-C10 alkyl, and $L^1$ and $L^2$ are each independently selected from C1-C10 alkylene, C2-C15 alkenylene, C3-C10 cycloalkylene, and C6-C20 arylene.

More specifically, the present invention provides a polymer for an organic bottom anti-reflective coating including one or more chemical structures selected from Chemical Formulas 1-1, 1-2, and 1-3 below and one or more chemical structures selected from Chemical Formulas 2-1, 2-2, and 2-3 below. More preferably, the polymer for an organic bottom anti-reflective coating may further include one or more selected from Chemical Formulas 1-1 and 2-1 below and Chemical Formulas 1-2, 1-3, 2-2, and 2-3 below:

[Chemical Formula 1-1]

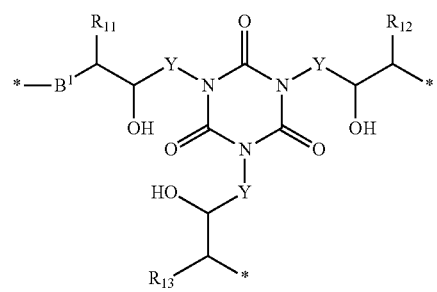

[Chemical Formula 1-2]

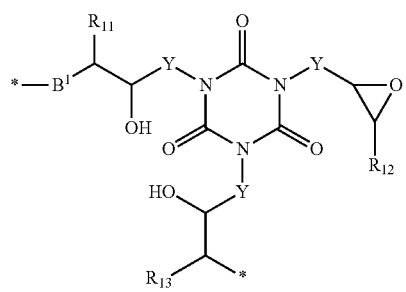

[Chemical Formula 1-3]

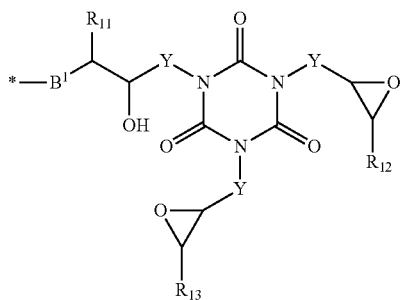

[Chemical Formula 2-1]

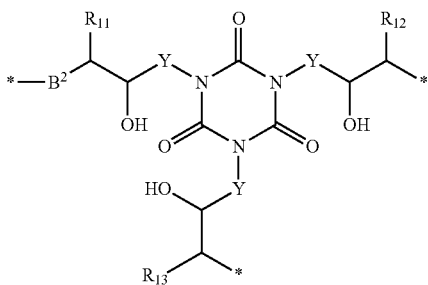

[Chemical Formula 2-2]

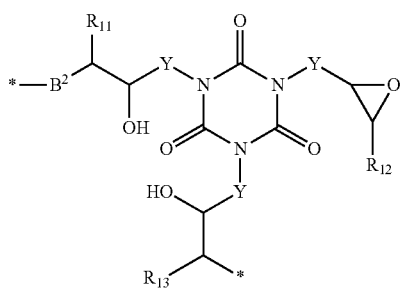

[Chemical Formula 2-3]

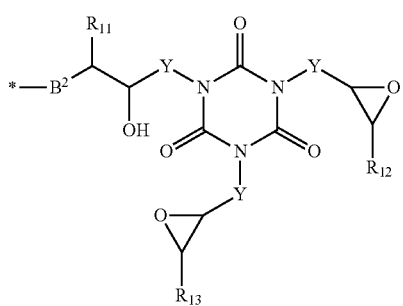

in Chemical Formulas 1-1, 1-2, 1-3, 2-1, 2-2, and 2-3, Y is a divalent linking group, and $R_{11}$, $R_{12}$, and $R_{13}$ are each selected from hydrogen and C1-C10 alkyl, and each of $B^1$ and $B^2$ is selected from Chemical Formula 3 below and has a different chemical structure,

[Chemical Formula 3]

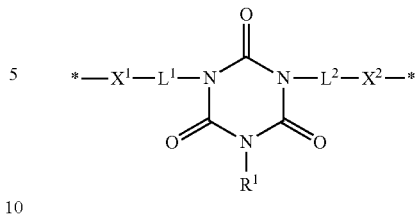

in Chemical Formula 3, $R^1$ is selected from hydrogen, C1-C40 hydrocarbyl, substituted C1-C40 hydrocarbyl, C1-C40 heterohydrocarbyl, and substituted C1-C40 heterohydrocarbyl, $X^1$ and $X^2$ are each independently selected from —O—, —COO—, —NR—, and —S—, and R is selected from hydrogen and C1-C10 alkyl, and $L^1$ and $L^2$ are each independently selected from C1-C10 alkylene, C2-C15 alkenylene, C3-C10 cycloalkylene, and C6-C20 arylene.

In addition, in an embodiment of the present invention, the polymer for an organic bottom anti-reflective coating may further include any one or two or more chemical structures selected from Chemical Formulas 4 and 5 below, necessarily including one or more chemical structures selected from Chemical Formulas 1-1, 1-2, and 1-3 above and one or more chemical structures selected from Chemical Formulas 2-1, 2-2, and 2-3 above:

[Chemical Formula 4]

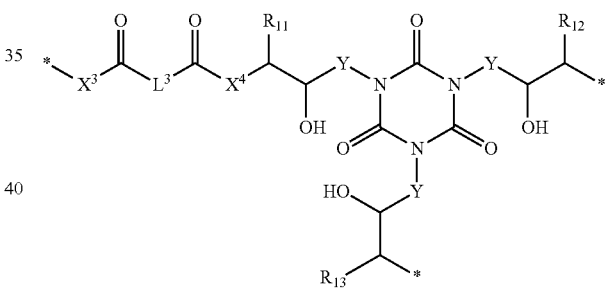

in Chemical Formula 4, Y is a divalent linking group, $R_{11}$, $R_{12}$, and $R_{13}$ are each selected from hydrogen and C1-C10 alkyl, $X^3$ and $X^4$ are each independently selected from —O—, —COO—, —NR—, and —S—, and R is selected from hydrogen and C1-C10 alkyl, and $L^3$ is selected from a direct bond, C1-C40 hydrocarbylene, and C1-C40 heterohydrocarbylene,

[Chemical Formula 5]

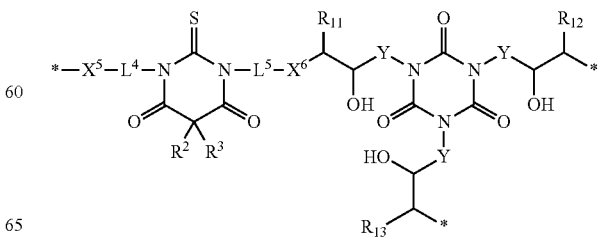

in Chemical Formula 5, Y is a divalent linking group, $R_{11}$, $R_{12}$, and $R_{13}$ are each selected from hydrogen and C1-C10 alkyl, $R^2$ and $R^3$ are each independently selected from hydrogen, halogen, nitro, cyano, hydroxy, C1-C40 hydrocarbyl, substituted C1-C40 hydrocarbyl, C1-C40 heterohydrocarbyl, and substituted C1-C40 heterohydrocarbyl, or $R^2$ and $R^3$ may be an alicyclic ring linked via C1-C40 hydrocarbylene with or without a hetero atom, $X^5$ and $X^6$ are each independently selected from —O—, —COO—, —NR—, and —S—, and R is selected from hydrogen and C1-C10 alkyl, and $L^4$ and $L^5$ are each independently selected from C1-C10 alkylene, C2-C15 alkenylene, C3-C10 cycloalkylene, and C6-C20 arylene.

More specifically, when one or more chemical structures selected from Chemical Formulas 1-1, 1-2, and 1-3 above are referred to as B-1, one or more chemical structures selected from Chemical Formulas 2-1, 2-2, and 2-3 above are referred to as B-1', the chemical structure represented by Chemical Formula 4 is referred to as B-2, and the chemical structure represented by Chemical Formula 5 is referred to as B-3, the present invention may be embodied in the following aspects, which is an example shown for explaining the present invention in more detail, and thus it should not be construed as limiting the present invention.

A first aspect of the polymer of the present invention includes B-1 and B-1'.

A second aspect of the polymer of the present invention includes B-1, B-1', and B-2.

A third aspect of the polymer of the present invention includes B-1, B-1', and B-3.

A fourth aspect of the polymer of the present invention includes B-1, B-1', B-2, and B-3.

In an embodiment of the present invention, in Chemical Formulas 1-1, 1-2, 1-3, 2-1, 2-2, 2-3, 4 and 5, Y is not limited as long as it is a divalent linking group, and more specifically, Y may be, for example, C1-C10 alkylene. More specifically, Y may be a linear or branched C1-C10 alkylene. More specifically, Y may be a linear or branched C1-C6 alkylene.

In an embodiment of the present invention, in Chemical Formulas 1-1, 1-2, 1-3, 2-1, 2-2, 2-3, 4 and 5, $R_{11}$, $R_{12}$ and $R_{13}$ may be each independently selected from hydrogen and C1-C10 alkyl. More specifically, for example, $R_{11}$, $R_{12}$ and $R_{13}$ may be each selected from linear or branched chain C1-C10 alkyl. More specifically, $R_{11}$, $R_{12}$ and $R_{13}$ may be selected from hydrogen and C1-C5 alkyl.

In an embodiment of the present invention, in Chemical Formula 3, $R^1$ is selected from hydrogen, C1-C40 hydrocarbyl, substituted C1-C40 hydrocarbyl, C1-C40 heterohydrocarbyl, and substituted C1-C40 heterohydrocarbyl.

More specifically, $R^1$ may be, for example, selected from hydrogen, C1-C20 alkyl, C2-C20 alkenyl, C2-C20 alkynyl, C1-C10 alkoxy, C3-C20 cycloalkyl, C6-C20 aryl, C3-C20 cycloalkyl C1-C20 alkyl, C6-C20 aryl C1-C20 alkyl, C1-C20 alkyl C6-C20 aryl, C2-C20 alkenyl C1-C20 alkyl, and C2-C20 alkynyl C1-C20 alkyl, but is not limited thereto. Further, the above alkyl, alkenyl, alkynyl, alkoxy, cycloalkyl, aryl, cycloalkylalkyl, arylalkyl, alkylaryl, alkenylalkyl and alkynylalkyl may be further substituted with halogen.

More specifically, $R^1$ is preferably selected from C1-C20 alkyl and C3-C10 cycloalkyl C1-C10 alkyl since it is easy to adjust a refractive index and a contact angle to be desirable, but the present invention is not limited thereto. More specifically, $R^1$ may be C1-C12 alkyl or C3-C7 cycloalkyl C1-C10 alkyl. More specifically, $R^1$ is selected from methyl, ethyl, propyl, butyl, pentyl, hexyl, heptyl, octyl, nonyl, decyl, undecyl, dodecyl, cyclobutylethyl and cyclopentylethyl.

In addition, $B^1$ is a chemical structure in which $R^1$ in Chemical Formula 3 is C1-C4 alkyl, and $B^2$ is a chemical structure in which $R^1$ in Chemical Formula 3 is C6-C14 alkyl or C3-C5 cycloalkyl C1-C10 alkyl, but $B^1$ and $B^2$ are not limited thereto.

In an embodiment of the present invention, in Chemical Formula 3, $X^1$ and $X^2$ are each independently selected from —O—, —COO—, —NR—, and —S—, and R is selected from hydrogen and C1-C10 alkyl. More specifically, $X^1$ and $X^2$ may be each independently —O—, —COO—, —S—, —NH—, —NHCH$_2$—, —NHCH$_2$CH$_2$—, —NHC$_6$H$_{10}$— or —NHC$_6$H$_4$—. More preferably, $X^1$ and $X^2$ may be —COO—, but $X^1$ and $X^2$ are not limited thereto.

In an embodiment of the present invention, in Chemical Formula 3, $L^1$ and $L^2$ are each independently selected from C1-C10 alkylene, C2-C15 alkenylene, C3-C10 cycloalkylene, and C6-C20 arylene.

More specifically, it is preferable that $L^1$ and $L^2$ may be each independently C1-C10 alkylene since it is easy to adjust a refractive index and a contact angle so as to be desirable, but the present invention is not limited thereto. More specifically, $L^1$ and $L^2$ are selected from methylene, ethylene, propylene, butylene, pentylene, hexylene, heptylene, octylene, etc.

In an embodiment of the present invention, the chemical structures represented by Chemical Formulas 1-1, 1-2, 1-3, 2-1, 2-2, and 2-3 may be derived from a compound represented by Chemical Formula 10 and Chemical Formula 11 below, but the present invention not limited thereto. The term "derived" means that reactants are polymerized to obtain a polymer. Further, any one or more of the epoxy end groups of Chemical Formula 10 may be ring-opened by reacting with *—$X^1$—H or *—$X^2$—H of Chemical Formula 11 below. Here, the catalyst used in the polymerization is not limited, but any one or two or more catalysts selected from benzyltriethylammonium chloride, tetrabutylammonium chloride, tetraethylammonium bromide, and the like, may be used. In addition, the compound represented by Chemical Formula 10 below may be included in an amount of 30 to 60 wt % and the compound represented by Chemical Formula 11 below may be included in an amount of 40 to 70 wt %, but the present invention is not limited thereto.

[Chemical Formula 10]

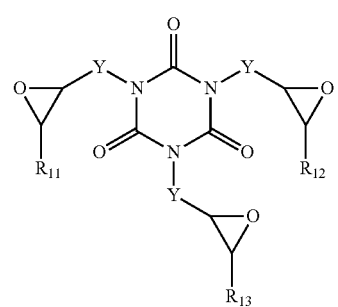

In Chemical Formula 10, Y is a divalent linking group, and more specifically, Y may be C1-C10 alkylene. $R_{11}$, $R_{12}$ and $R_{13}$ are each selected from hydrogen and C1-C10 alkyl, and more specifically may be hydrogen.

[Chemical Formula 11]

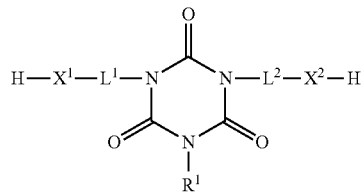

in Chemical Formula 11, $R^1$ is selected from hydrogen, C1-C40 hydrocarbyl, substituted C1-C40 hydrocarbyl, C1-C40 heterohydrocarbyl, and substituted C1-C40 heterohydrocarbyl, $X^1$ and $X^2$ are each independently selected from —O—, —COO—, —NR—, and —S—, and R is selected from hydrogen and C1-C10 alkyl, and $L^1$ and $L^2$ are each independently selected from C1-C10 alkylene, C2-C15 alkenylene, C3-C10 cycloalkylene, and C6-C20 arylene.

Specifically, in Chemical Formula 11, $R^1$ may be, for example, selected from hydrogen, C1-C20 alkyl, C2-C20 alkenyl, C2-C20 alkynyl, C1-C10 alkoxy, C3-C20 cycloalkyl, C6-C20 aryl, C3-C20 cycloalkyl C1-C20 alkyl, C6-C20 aryl C1-C20 alkyl, C1-C20 alkyl C6-C20 aryl, C2-C20 alkenyl C1-C20 alkyl, and C2-C20 alkynyl C1-C20 alkyl, but is not limited thereto. Further, the above alkyl, alkenyl, alkynyl, alkoxy, cycloalkyl, aryl, cycloalkylalkyl, arylalkyl, alkylaryl, alkenylalkyl and alkynylalkyl may be further substituted with halogen.

More specifically, $R^1$ is preferably selected from C1-C20 alkyl and C3-C10 cycloalkyl C1-C10 alkyl since it is easy to adjust a refractive index and a contact angle so as to be desirable, but the present invention is not limited thereto. More specifically, $R^1$ may be C1-C12 alkyl or C3-C7 cycloalkyl C1-C10 alkyl. More specifically, $R^1$ is selected from methyl, ethyl, propyl, butyl, pentyl, hexyl, heptyl, octyl, nonyl, decyl, undecyl, dodecyl, cyclobutylethyl and cyclopentylethyl.

$X^1$ and $X^2$ may be —COO—, but $X^1$ and $X^2$ are not limited thereto.

$L^1$ and $L^2$ may be each independently C1-C10 alkylene.

In an embodiment of the present invention, examples of the compound represented by Chemical Formula 10 may include the following structures, but are not limited thereto:

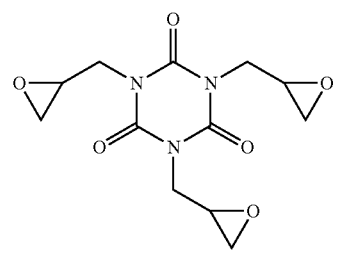

-continued

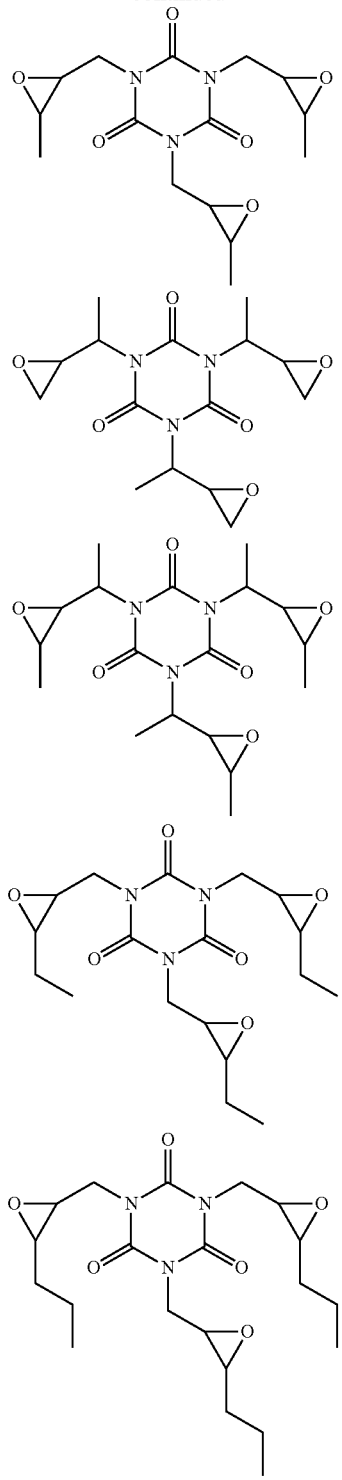

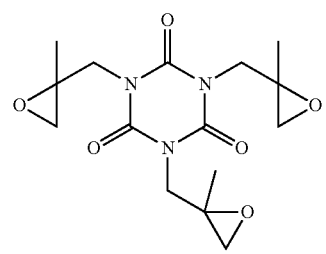

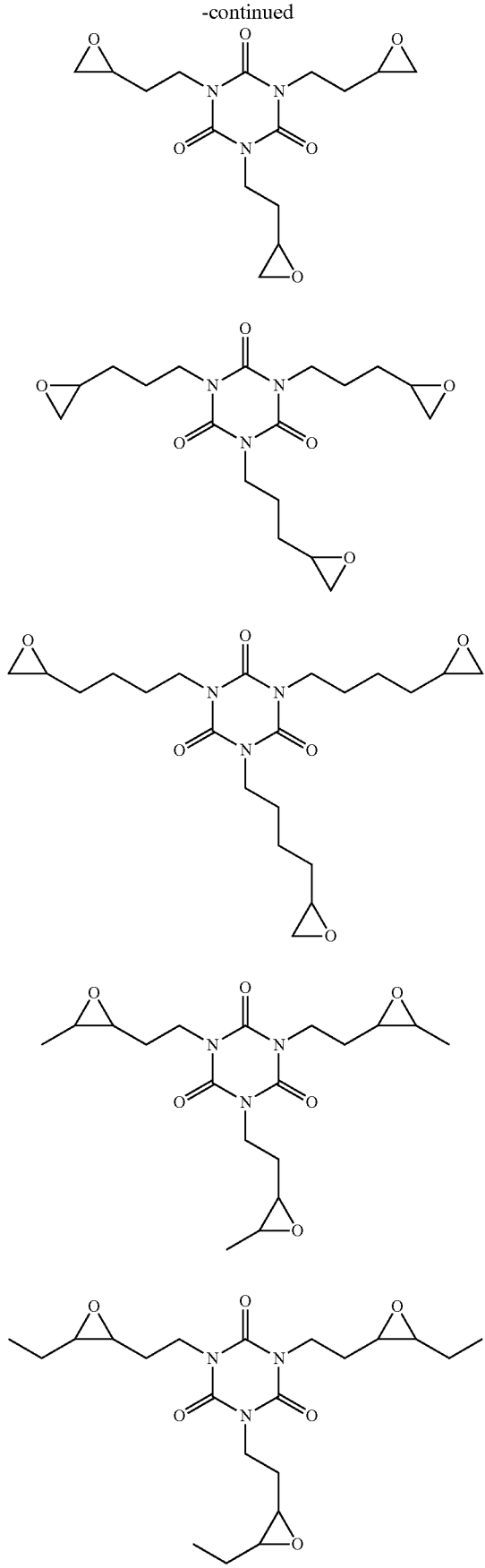
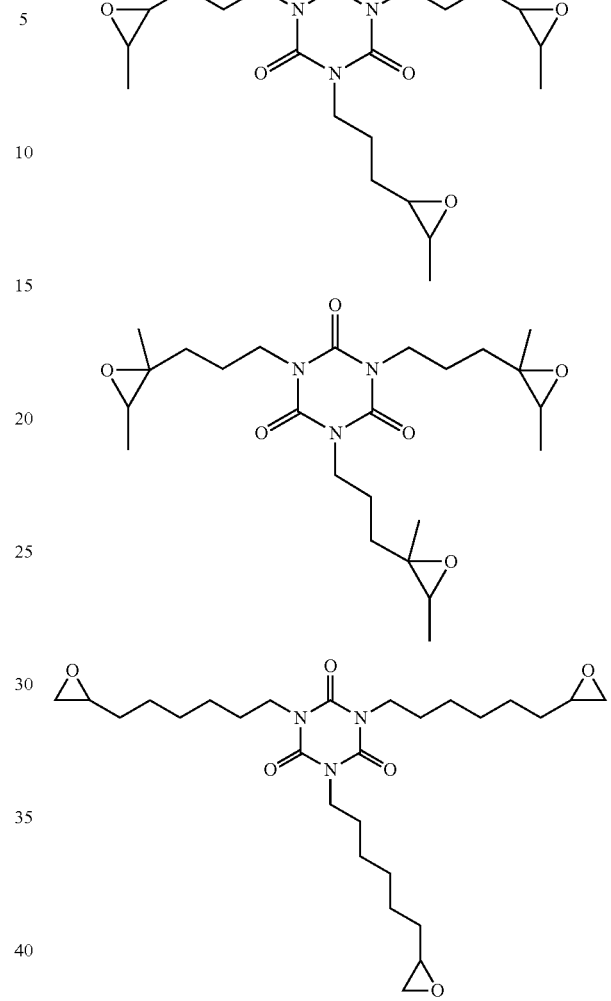
In an embodiment of the present invention, examples of the compound represented by Chemical Formula 11 may include the following structures, but are not limited thereto:
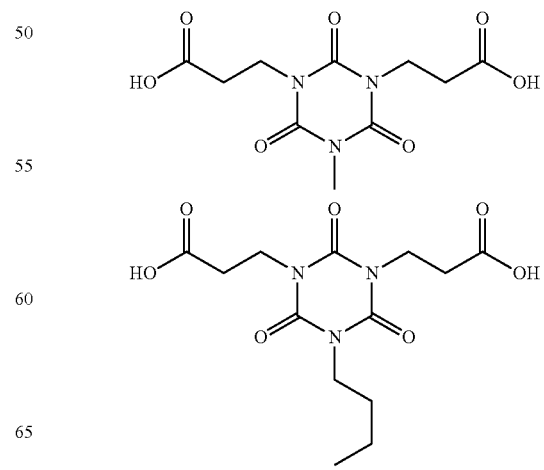

-continued

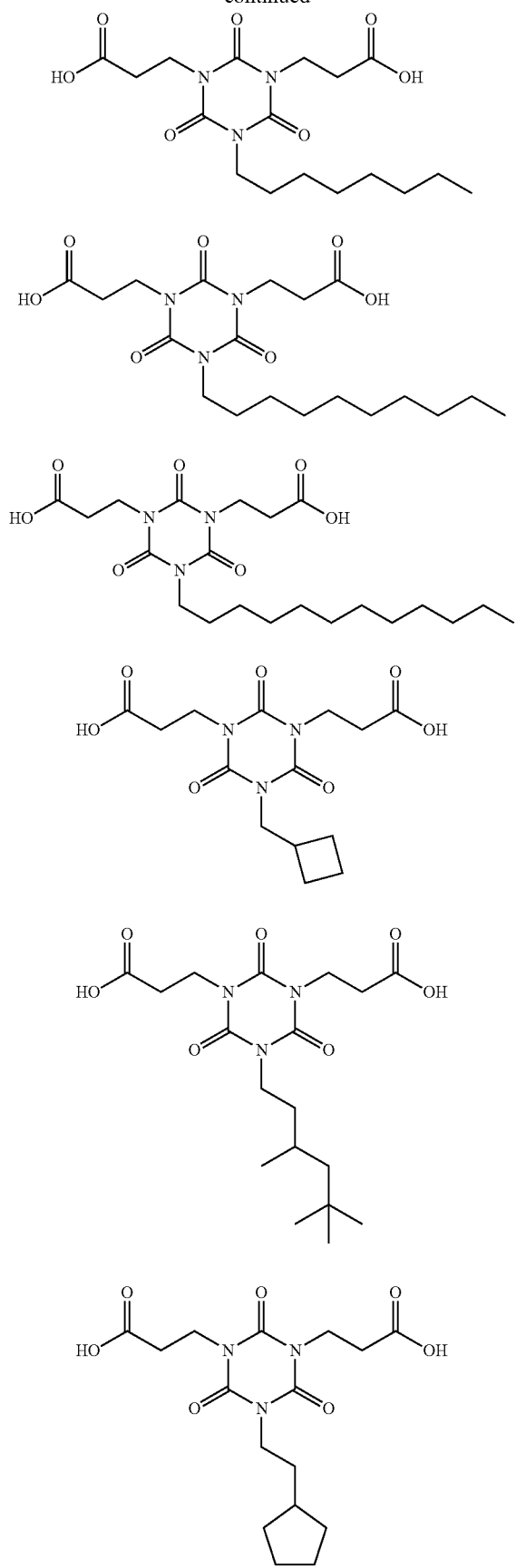

-continued

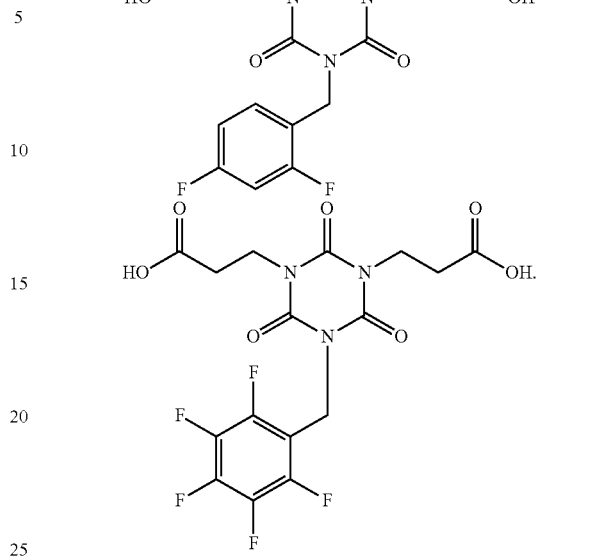

In an embodiment of the present invention, in Chemical Formula 4, $X^3$ and $X^4$ are each independently selected from —O—, —COO—, —NR—, and —S—, and R is selected from hydrogen and C1-C10 alkyl. More specifically, $X^3$ and $X^4$ may be each independently —O—, —COO—, —S—, —NH—, —NHCH$_2$—, —NHCH$_2$CH$_2$—, —NHC$_6$H$_{10}$— or —NHC$_6$H$_4$—. More preferably, $X^3$ and $X^4$ may be —COO—, but $X^3$ and $X^4$ are not limited thereto.

In an embodiment of the present invention, in Chemical Formula 4, $L^3$ is selected from a direct bond, C1-C40 hydrocarbylene, and C1-C40 heterohydrocarbylene.

More specifically, $L^3$ is selected from a direct bond, C1-C10 alkylene, C2-C15 alkenylene, and C6-C20 arylene, wherein the alkylene, alkenylene and arylene may be substituted with any one or two or more substituents selected from hydroxyl, amino, oxo (=O), thio (=S), and the like.

More specifically, it is preferable that $L^3$ may be C1-C10 alkylene since it is easy to adjust a refractive index and a contact angle so as to be desirable, but the present invention is not limited thereto.

In an embodiment of the present invention, the structure represented by Chemical Formula 4 may be derived from the compound represented by Chemical Formula 10 and the compound represented by Chemical Formula 12, but the present invention is not limited thereto. The term "derived" means that reactants are polymerized to obtain a polymer. Further, any one or more of the epoxy end groups of Chemical Formula 10 may be ring-opened by reacting with *—$X^3$—H or *—$X^4$—H of Chemical Formula 12 below. The amount of the compound represented by Chemical Formula 12 below is not limited, but may be 40 to 70 wt % in the composition for polymerization together with the compound represented by Chemical Formula 11 above. In other words, the amount of the compound represented by Chemical Formula 10 may be 30 to 60 wt %, and the total amount of the compound represented by Chemical Formula 11 and the compound represented by Chemical Formula 12 below may be 40 to 70 wt %:

[Chemical Formula 12]

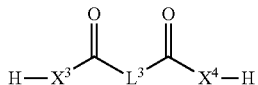

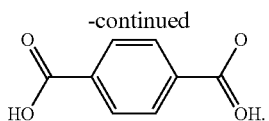

in Chemical Formula 12, $X^3$ and $X^4$ are each independently selected from —O—, —COO—, —NR—, and —S—, and R is selected from hydrogen and C1-C10 alkyl, and $L^3$ is selected from a direct bond, C1-C40 hydrocarbylene, and C1-C40 heterohydrocarbylene.

More specifically, in Chemical Formula 12, $X^3$ and $X^4$ may be each independently —O—, —COO—, —S—, —NH—, —NHCH$_2$—, —NHCH$_2$CH$_2$—, —NHC$_6$H$_{10}$— or —NHC$_6$H$_4$—. More preferably, $X^3$ and $X^4$ may be —COO—, but $X^3$ and $X^4$ are not limited thereto.

$L^3$ is selected from a direct bond, C1-C10 alkylene, C2-C15 alkenylene, and C6-C20 arylene, wherein the alkylene, alkenylene and arylene may be substituted with any one or two or more substituents selected from hydroxyl, amino, oxo (=O), thio (=S), and the like.

In an embodiment of the present invention, examples of the compound represented by Chemical Formula 12 may include the following structures, but are not limited thereto:

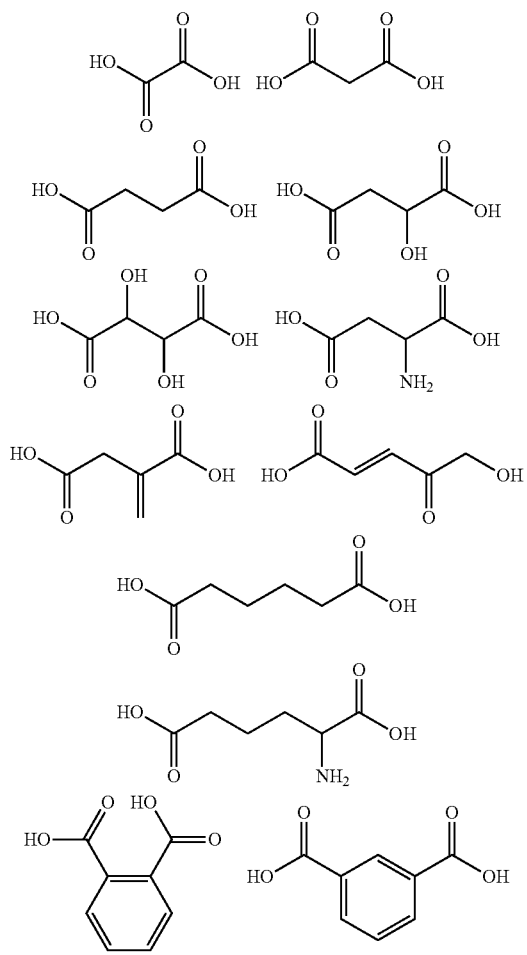

In an embodiment of the present invention, in Chemical Formula 5, $R^2$ and $R^3$ are each independently selected from hydrogen, halogen, nitro, cyano, hydroxy, C1-C40 hydrocarbyl, substituted C1-C40 hydrocarbyl, C1-C40 heterohydrocarbyl, and substituted C1-C40 heterohydrocarbyl, or $R^2$ and $R^3$ may be an alicyclic ring linked via C1-C40 hydrocarbylene with or without a hetero atom.

More specifically, $R^2$ and $R^3$ are each independently hydrogen, C1-C7 alkyl, cyano C1-C7 alkyl, C6-C12 aryl C1-C7 alkyl, C2-C7 alkenyl C1-C7 alkyl, C2-C7 alkynyl C1-C7 alkyl, C3-C7 cycloalkyl, C6-C12 aryl, halogen, nitro, C1-C7 alkoxy or C6-C12 aryloxy, or $R^2$ and $R^3$ may be linked via C2-C5 alkylene with or without one or more hetero atoms selected from N, O and S to form a ring.

More specifically, $R^2$ and $R^3$ are each independently hydrogen, methyl, ethyl, propyl, butyl, pentyl, hexyl, heptyl, vinyl, allyl, allylmethyl, ethynyl, ethynylmethyl, ethynylethyl, cyclopropyl, cyclobutyl, cyclopentyl, cyclohexyl, cycloheptyl, phenyl, naphthyl, benzyl, fluoro, chloro, iodo, bromo, amino, methylamino, ethylamino, dimethylamino, diethylamino, cyclohexylamino, phenylamino, cyano, cyanomethyl, cyanoethyl, methoxy, ethoxy, or propoxy, and $R^2$ and $R^3$ may be linked via —CH$_2$CH$_2$—, —CH$_2$CH$_2$CH$_2$—, —CH$_2$CH$_2$CH$_2$CH$_2$—, —CH$_2$CH$_2$CH$_2$CH$_2$CH$_2$—, CH$_2$CH$_2$OCH$_2$CH$_2$— to form a ring.

In an embodiment of the present invention, in Chemical Formula 5, $X^5$ and $X^6$ are each independently selected from —O—, —COO—, —NR—, and —S—, and R is selected from hydrogen and substituted or unsubstituted C1-C10 alkyl. More specifically, $X^5$ and $X^6$ may be each independently —O—, —COO—, —S—, —NH—, —NHCH$_2$—, —NHCH$_2$CH$_2$—, —NHC$_6$H$_{10}$— or —NHC$_6$H$_4$—. More preferably, $X^5$ and $X^6$ may be —COO—, but $X^5$ and $X^6$ are not limited thereto.

In an embodiment of the present invention, in Chemical Formula 5, $L^4$ and $L^5$ are each independently selected from C1-C10 alkylene, C2-C15 alkenylene, C3-C10 cycloalkylene, and C6-C20 arylene.

More specifically, it is preferable that $L^4$ and $L^5$ may be each independently C1-C10 alkylene since it is easy to adjust a refractive index and a contact angle so as to be desirable, but the present invention is not limited thereto. More specifically, $L^4$ and $L^5$ are selected from methylene, ethylene, propylene, butylene, pentylene, hexylene, heptylene, and octylene.

In an aspect of the present invention, the structure represented by Chemical Formula 5 may be derived from the compound represented by Chemical Formula 10 and a compound represented by Chemical Formula 13 below, but the present invention is not limited thereto. The term "derived" means that reactants are polymerized to obtain a polymer. Further, any one or more of the epoxy end groups of Chemical Formula 10 may be ring-opened by reacting with *—$X^5$—H or *—$X^6$—H of Chemical Formula 13 below. The amount of the compound represented by Chemical Formula 13 below is not limited, but may be 40 to 70 wt % in the composition for polymerization together with the compound represented by Chemical Formula 11 above. In other words, the amount of the compound represented by Chemical Formula 10 may be 30 to 60 wt %, and the total amount of the compound represented by Chemical Formula 11 and the compound represented by Chemical Formula 13 may be 40 to 70 wt %. Further, the amount of the compound represented by Chemical Formula 10 may be 30 to 60 wt %, and the total amount of the compound represented by Chemical Formula 11, the compound represented by Chemical Formula 12, and the compound represented by Chemical Formula 13 below may be 40 to 70 wt %.

[Chemical Formula 13]

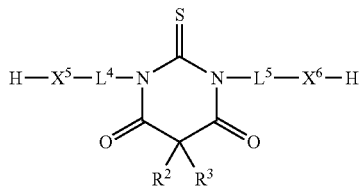

In Chemical Formula 13, $R^2$ and $R^3$ are each independently selected from hydrogen, halogen, nitro, cyano, hydroxy, C1-C40 hydrocarbyl, substituted C1-C40 hydrocarbyl, C1-C40 heterohydrocarbyl, and substituted C1-C40 heterohydrocarbyl, or $R^2$ and $R^3$ may be an alicyclic ring linked via C1-C40 hydrocarbylene with or without a hetero atom, $X^5$ and $X^6$ are each independently selected from —O—, —COO—, —NR—, and —S—, and R is selected from hydrogen and C1-C10 alkyl, and $L^4$ and $L^5$ are each independently selected from C1-C10 alkylene, C2-C15 alkenylene, C3-C10 cycloalkylene, and C6-C20 arylene.

More specifically, in Chemical Formula 13, $R^2$ and $R^3$ are each independently hydrogen, C1-C7 alkyl, cyano C1-C7 alkyl, C6-C12 aryl C1-C7 alkyl, C2-C7 alkenyl C1-C7 alkyl, C2-C7 alkynyl C1-C7 alkyl, C3-C7 cycloalkyl, C6-C12 aryl, halogen, nitro, C1-C7 alkoxy or C6-C12 aryloxy, or $R^2$ and $R^3$ may be linked via C2-C5 alkylene with or without one or more hetero atoms selected from N, O and S to form a ring.

More specifically, $R^2$ and $R^3$ may be each independently hydrogen, methyl, ethyl, propyl, butyl, pentyl, hexyl, heptyl, vinyl, allyl, allylmethyl, ethynyl, ethynylmethyl, ethynylethyl, cyclopropyl, cyclobutyl, cyclopentyl, cyclohexyl, cycloheptyl, phenyl, naphthyl, benzyl, fluoro, chloro, iodo, bromo, amino, methylamino, ethylamino, dimethylamino, diethylamino, cyclohexylamino, phenylamino, cyano, cyanomethyl, cyanoethyl, methoxy, ethoxy or propoxy, or $R^2$ and $R^3$ may be linked via —CH$_2$CH$_2$—, —CH$_2$CH$_2$CH$_2$—, —CH$_2$CH$_2$CH$_2$CH$_2$—, —CH$_2$CH$_2$CH$_2$CH$_2$CH$_2$—, CH$_2$CH$_2$OCH$_2$CH$_2$— to form a ring.

$X^5$ and $X^6$ may be each independently —O—, —COO—, —S—, —NH—, —NHCH$_2$—, —NHCH$_2$CH$_2$—, —NHC$_6$H$_{10}$— or —NHC$_6$H$_4$—. More preferably, $X^5$ and $X^6$ may be —COO—, but are not limited thereto.

It is preferable that $L^4$ and $L^5$ may be each independently C1-C10 alkylene since it is easy to adjust a refractive index and a contact angle so as to be desirable, but the present invention is not limited thereto.

In an embodiment of the present invention, examples of the compound represented by Chemical Formula 13 may include the following structures, but are not limited thereto:

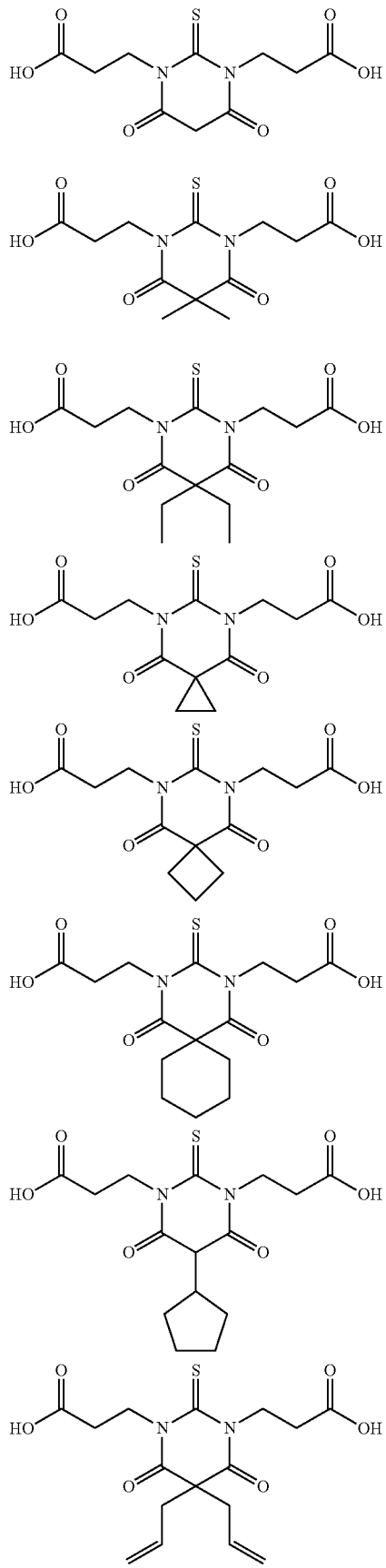

-continued
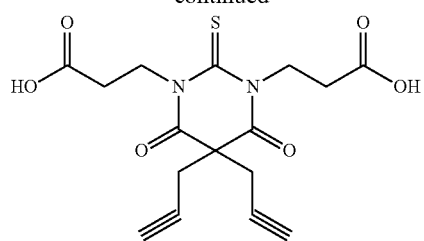
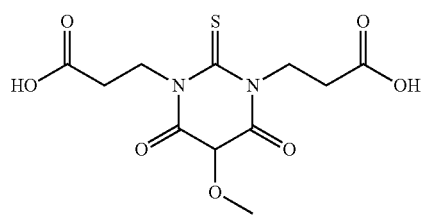
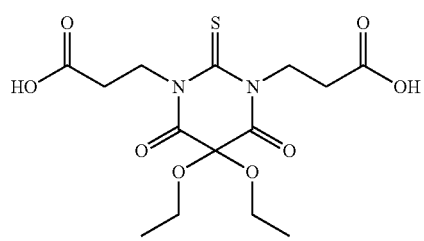
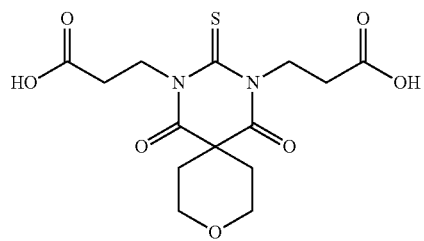
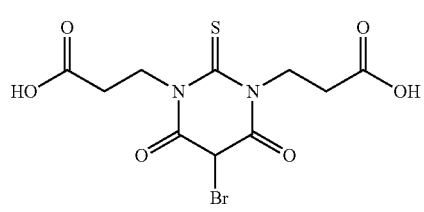
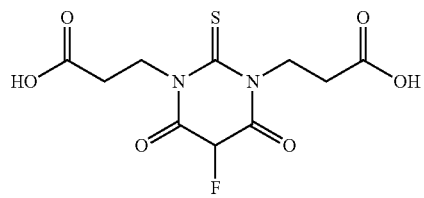
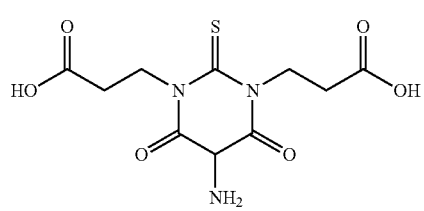
-continued
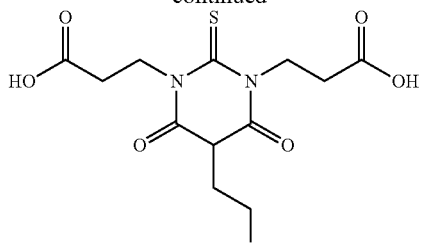
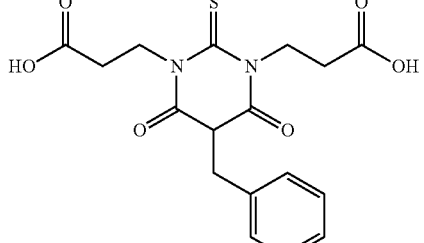
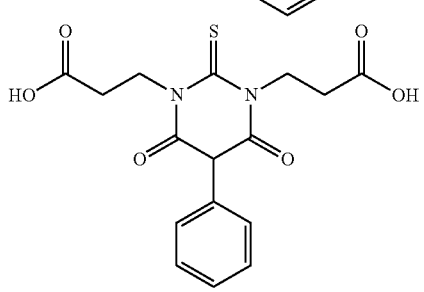
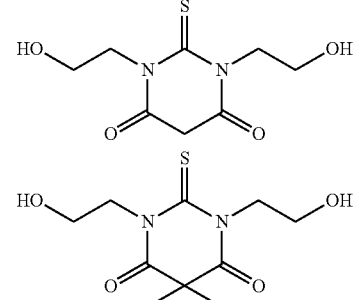
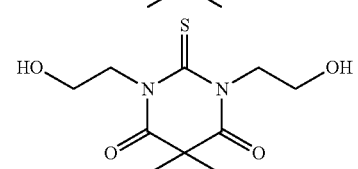
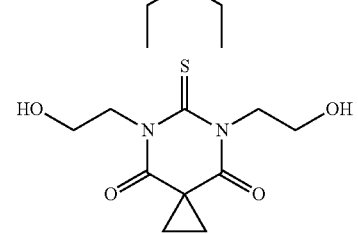
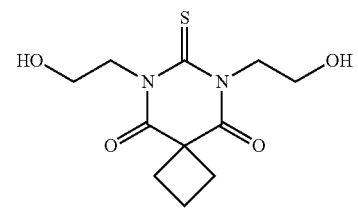

-continued
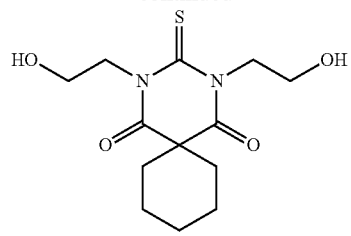
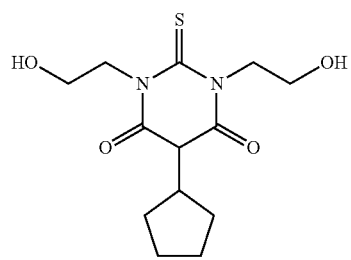
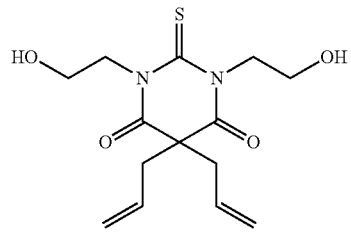
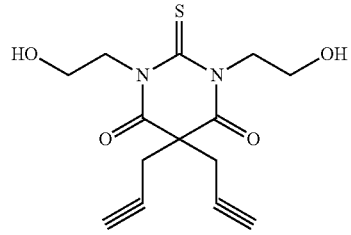
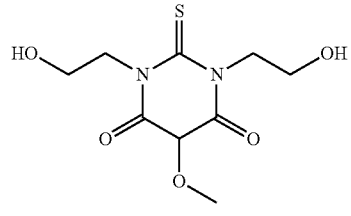
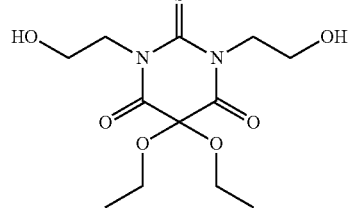
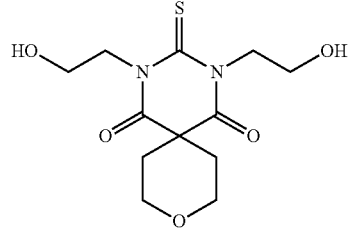
-continued
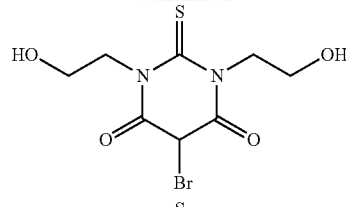
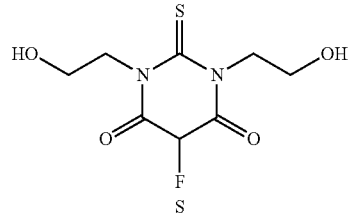
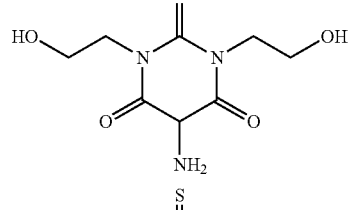
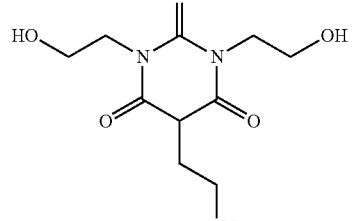
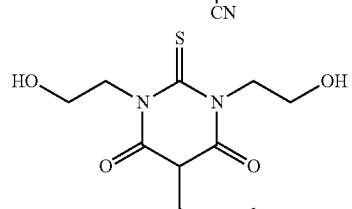
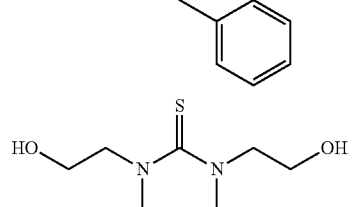
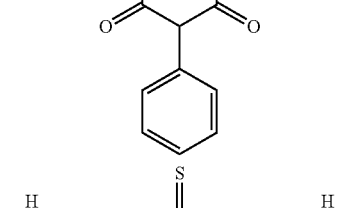
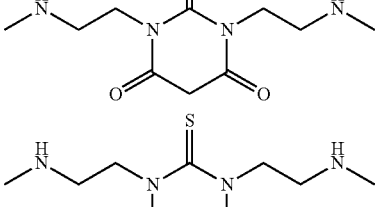

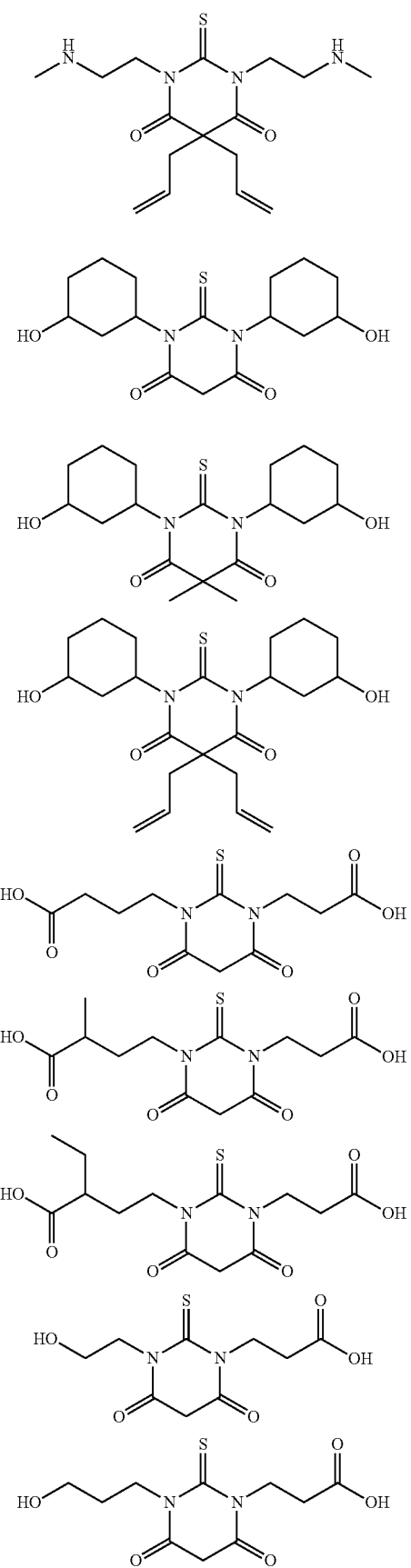

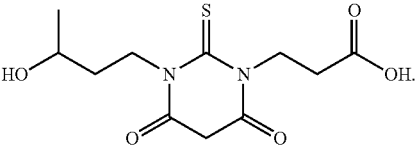

The polymer according to the present invention may have a polystyrene conversion average molecular weight (Mw) of 1,000 to 30,000 g/mol, more specifically 2,000 to 20,000 g/mol measured by gel permeation chromatography (GPC). The above-described range is preferable since when forming the organic bottom anti-reflective coating, it is insoluble in the photoresist solvent and has excellent solubility with respect to solvents, and since the etch rate of the organic bottom anti-reflective coating in a dry etching process is excellent, but this range is not limited thereto.

Another aspect of the present invention is a bottom anti-reflective coating composition containing the polymer as described above. Specifically, the bottom anti-reflective coating composition may contain the above-described polymer and a solvent.

In the bottom anti-reflective coating composition according to an embodiment of the present invention, the polymer may be included in an amount of 1 to 50 wt %, preferably 1 to 30 wt %, and more preferably 2 to 20 wt % of the total weight of the composition. When the polymer is included in an amount of 1 to 50 wt %, it is preferable since it is possible to form a bottom anti-reflective film having a uniform thickness, but the present invention is not limited thereto.

In addition, the bottom anti-reflective coating composition of the present invention may further include an additive commonly used in the field. Specifically, the bottom anti-reflective coating composition may further include, for example, any one or two or more additive(s) selected from an acid catalyst, an acid generator, a cross-linking agent, a defoaming agent, a light absorber, a curing agent, a surfactant, and the like.

The organic solvent that is usable in the bottom anti-reflective coating composition of the present invention is not limited as long as it is able to dissolve the polymer and the additives such as an acid catalyst, an acid generator, a cross-linking agent, a polymer, a defoaming agent, a light absorber, a curing agent, a surfactant, and the like. Specifically, for example, an organic solvent generally used in a semiconductor manufacturing process may be any one or a mixture of two or more selected from cyclohexanone, cyclopentanone, 2-heptanone, propylene glycol monomethyl ether (PGME), propylene glycol monomethyl acetate (PG-MEA), propylene glycol monomethyl ether acetate, gamma-butyrolactone, tetrahydrofurfural alcohol, ethyl lactate, dimethyl sulfoxide, propylene glycol n-propyl ether, dimethylformamide (DMF), dimethylacetamide (DMAC), ethoxyethanol, methoxyethanol, methyl-2-hydroxyisobutyrate, methyl 3-methoxypropionate (MMP), ethyl 3-ethoxypropionate (EEP), N-methylpyrrolidone (NMP), and the like. The organic solvent may be included in an amount of 50 to 99 wt %, preferably 70 to 99 wt %, and more preferably 80 to 98 wt % of the total weight of the composition. The above-described range is preferable since the bottom anti-reflective coating having a uniform thickness is able to be formed, but is not limited thereto.

The cross-linking agent that is usable in the bottom anti-reflective coating composition of the present invention is to induce a cross-linking reaction to further cure the bottom anti-reflective coating. As the cross-linking agent of the present invention, a conventional cross-linking agent may be used. For example, at least one compound selected from the following structures may be used, but the present invention is not limited thereto:

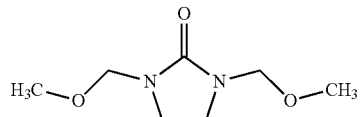

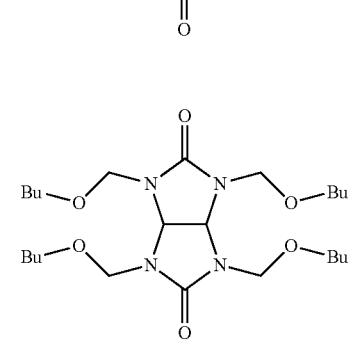

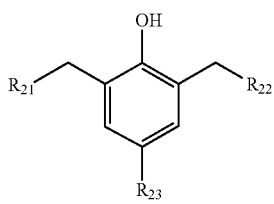

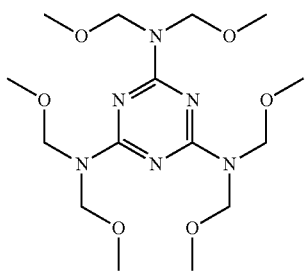

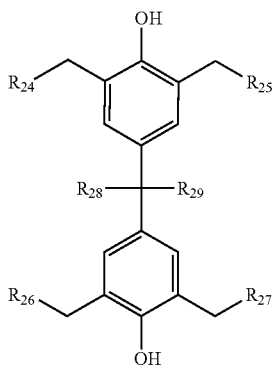

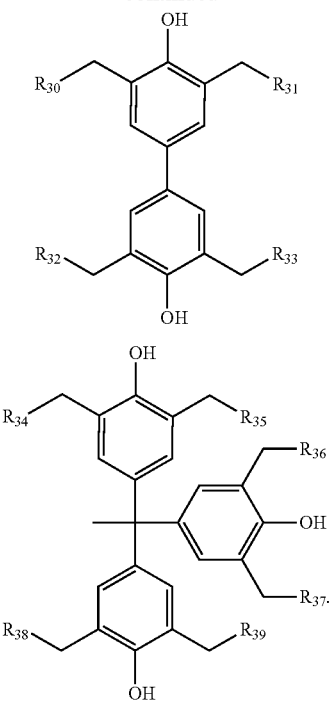

In the above-described structure, $R_{21}$, $R_{22}$, $R_{24}$ to $R_{27}$ and $R_{30}$ to $R_{39}$ are each independently hydroxy or C1-C3 alkoxy; $R_{23}$ is C1-C10 alkyl; $R_{28}$ and $R_{29}$ are each independently hydrogen, C1-C10 alkyl or halo C1-C10 alkyl.

The cross-linking agent usable in the present invention may be specifically exemplified by the following structures, but is not limited thereto:

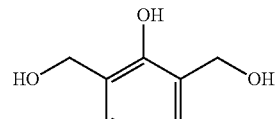

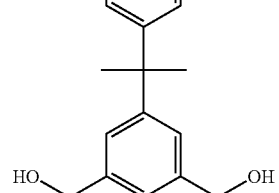

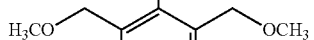

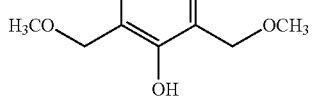

-continued

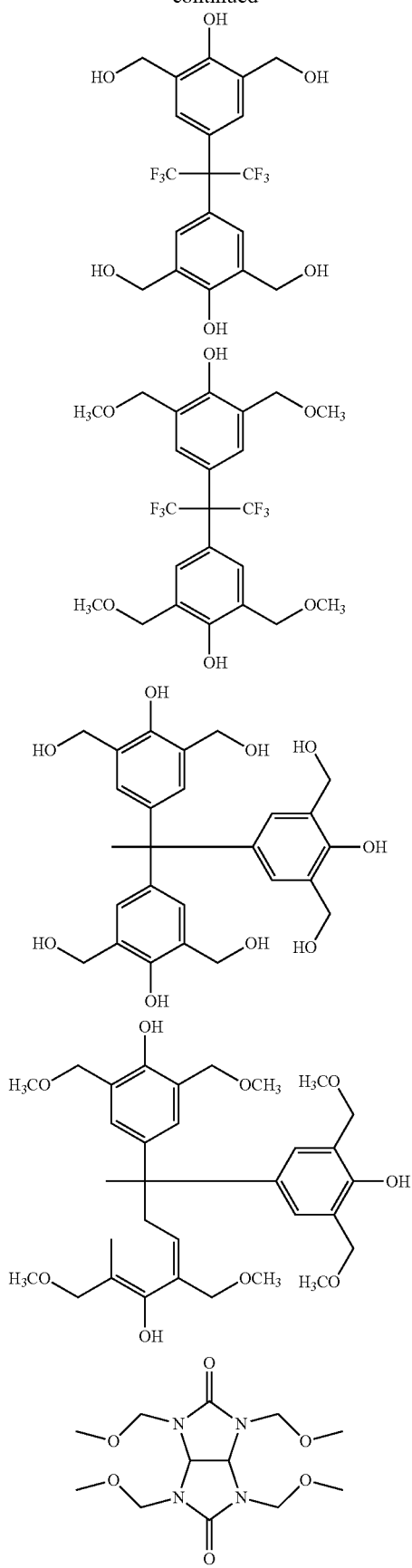

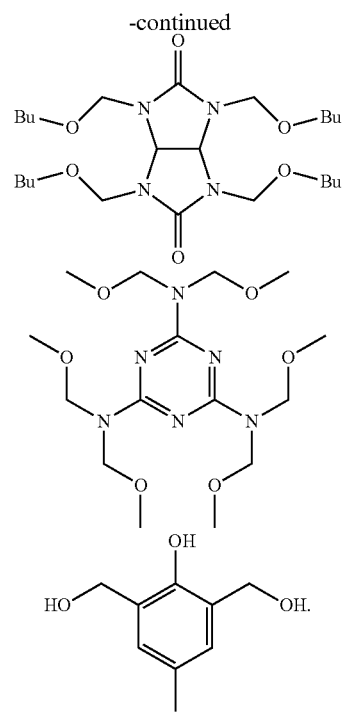

The amount of the cross-linking agent to be used varies slightly depending on the kind, but is preferably 0.1 to 30 parts by weight, preferably 0.1 to 20 parts by weight, and more preferably 5 to 20 parts by weight based on 100 parts by weight of the polymer of the present invention. If the cross-linking agent is used in an excessively small amount, cross-linking may not proceed sufficiently, and thus the organic bottom anti-reflective coating may not be formed. If the cross-linking agent is used in an excessively large amount, the cross-linking agent may remain after cross-linking, causing footing in the pattern profile, and thus it is preferable to use the cross-linking agent within the above-described range. However, the amount of the cross-linking agent is not limited thereto.

A cross-linking catalyst may be used to increase a cross-linking rate in the cross-linking process. Among the cross-linking catalyst, the acid catalyst or the acid generator acts more favorably than a basic catalyst. As the acid generator, both an acid generator that generates an acid by thermal decomposition and an acid generator that generates an acid by light irradiation may be used.

The acid catalyst or acid generator that is usable in the bottom anti-reflective coating composition of the present invention is intended to promote the cross-linking reaction of the polymer for an organic bottom anti-reflective coating by lowering the temperature of the cross-linking reaction. The acid catalyst or the acid generator that is usable in the present invention is not limited, but may be, for example, any one or a mixture of two or more selected from compounds of the following structures:

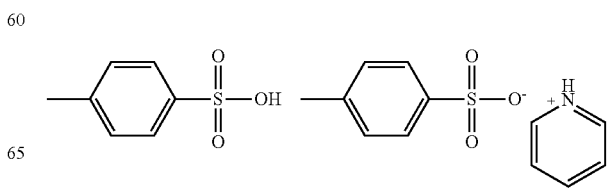

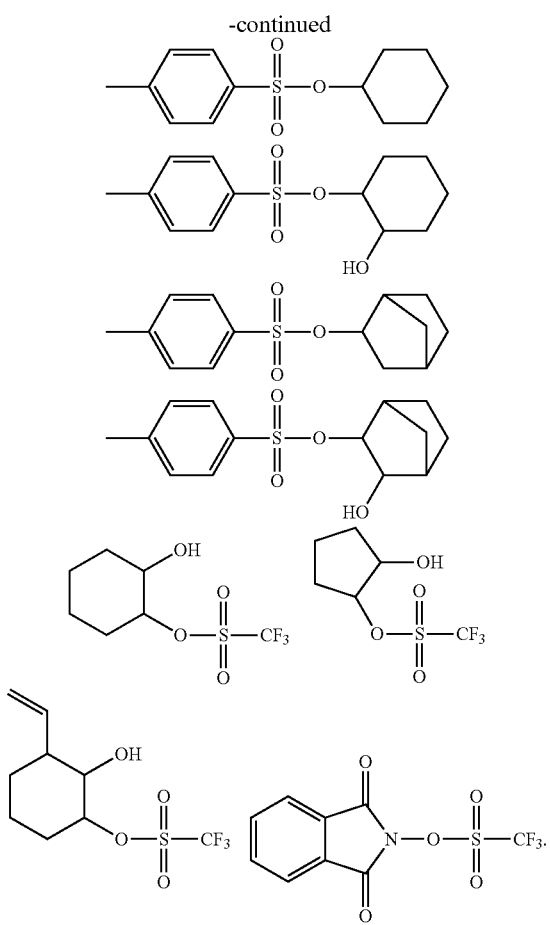

The acid catalyst may be divided into a strong acid such as toluenesulfonic acid and a potential acid generator which is decomposed by heat to generate an acid. In the preparation of the composition, it is advantageous in view of storage stability to use a potential acid generator rather than a strong acid such as toluenesulfonic acid. When the strong acid is used, the storage stability of the organic bottom anti-reflective coating composition may be deteriorated. The amount of the acid catalyst or the acid generator to be used is suitably 0.01 to 10 parts by weight, preferably 0.05 to 5 parts by weight, and more preferably 0.1 to 5 parts by weight, based on 100 parts by weight of the polymer. If the acid catalyst or the acid generator is used in an excessively small amount, the organic bottom anti-reflective coating may not be formed. If the acid catalyst or the acid generator is used in an excessively large amount, physical properties of a cured product may be deteriorated. Thus it is suitable to use the acid catalyst or the acid generator within the above-described range. However, the amount of the acid catalyst or the acid generator is not limited thereto.

A surfactant usable in the organic bottom anti-reflective coating composition of the present invention may be used to improve coating uniformity when forming an organic bottom anti-reflective coating. The surfactant is not limited as long as it is generally used in the corresponding field, and specifically commercialized examples thereof may include Sulfinol series manufactured by Air Products, F-410, F-444, F-477, R-08, and R-30 manufactured by DIC, and the like. When the surfactant is used, the amount of the surfactant may be 0.1 to 1 part by weight, preferably 0.2 to 0.8 part by weight based on 100 parts by weight of the total organic bottom anti-reflective coating composition. The amount within the above-described range is sufficient to improve the coating uniformity, but is not limited thereto.

The organic bottom anti-reflective coating composition of the present invention may further include other polymers in addition to the polymers including the chemical structures represented by Chemical Formulas 1-1, 1-2, 1-3, 2-1, 2-2, 2-3, 4 and 5 above. The polymer that may be further added may include a hydroxyl group, a glycidyl group, an acetal group, and the like. The polymer may be obtained by polymerizing acrylate-based, maleic anhydride-based, phenol-based and ester-based monomers, and is not particularly limited as long as it includes a cross-linking site at the linear or branched chain terminal. The polymer may include a moiety acting as a light absorber. When the polymer includes the moiety acting as the light absorber, the polymer may be effectively used for the organic bottom anti-reflective coating composition. The polymer may be preferably a polymer obtained by polymerizing an ester monomer, and more preferably a polymer including propionic acid ethyl ester and propionic acid chlorobenzyl ester as repeating units. When the polymer is used for the organic bottom anti-reflective coating, the refractive index may be increased, and in particular, hydrophilicity and hydrophobicity may be controlled while having a high refractive index in the organic bottom anti-reflective coating composition region. Therefore, the polymer is particularly useful for the organic bottom anti-reflective coating in the ultrafine pattern formation lithography process using a 193 nm ArF excimer laser. In addition, when the polymer is used, it is possible to absorb light while forming a cross-linking structure in one repeating unit, and thus reactivity with a resist layer may be controlled in a process after the organic bottom anti-reflective coating is formed, and an etching rate may be increased.

The organic bottom anti-reflective coating using a polymer including a hydroxyl group, a glycidyl group, an acetal group, or the like is cured while being subjected to a baking process after being applied on a substrate, and has a solvent resistance with respect to a solvent. Accordingly, the polymer has stability to prevent the anti-reflection coating from being dissolved by a solvent of a photosensitizer when the organic bottom anti-reflective coating is laminated after the photosensitizer is applied, which may be preferably used in the organic bottom anti-reflective coating composition.

The light absorber usable in the organic bottom anti-reflective coating composition of the present invention, which is a chemical species capable of absorbing light, may be used for controlling the amount of the light absorbing chemical species even when the light absorber is separately contained in the polymer which is not capable of absorbing light, as well as when the light absorber is contained in the polymer. The light absorber may include a chromophore having a high absorbance capable of absorbing light at 193 nm and functional groups for heat curing, and may be synthesized by a conventional method.

The curing agent usable in the organic bottom anti-reflective coating composition of the present invention is to assist curing and performance improvement of the polymer and the light absorber, and may include two or more cross-linking forming functional groups per compound, wherein it is preferable that the cross-linking forming functional group is capable of reacting with a functional group of the polymer and a functional group of the light absorber. Examples of the curing agent may include an aminoplastic compound, a polyfunctional epoxy resin, dianhydride, a mixture thereof, and the like. Examples of the aminoplastic compound may include dimethoxymethyl glycoluril, diethoxymethyl glycoluril, and a mixture thereof, diethyldimethylmethylglycoluril, tetramethoxymethylglycoluril, a hexamethoxymethyl melamine resin, and the like. However, the present invention is not limited thereto.

The organic bottom anti-reflective coating composition according to the present invention may be prepared by blending the above-described components in a conventional manner, and has a film-forming property in which a film is able to be formed by conventional spin coating.

Further, the present invention provides a method for forming an organic bottom anti-reflective coating using the organic bottom anti-reflective coating composition. Specifically, the method for forming an organic bottom anti-reflective coating includes a) applying an organic bottom anti-reflective coating composition to an upper part of a substrate; and b) heating the substrate applied with the organic bottom anti-reflective coating composition of step a) to form an organic bottom anti-reflective coating.

The substrate is typically usable, and may be a silicon wafer, a glass substrate, or a polymer substrate.

The step of applying the organic bottom anti-reflective coating composition may be performed by a conventional method such as spin coating, roller coating, or the like, and the step of heating the applied organic bottom anti-reflective coating composition is to cross-link the applied organic bottom anti-reflective coating composition, and may be performed by heating the applied organic bottom anti-reflective coating composition in a device such as a high temperature plate, a convection oven, or the like. The cross-linking may be performed at 70 to 250° C., preferably at 150 to 210° C. If a heating temperature is less than 70° C., the solvent contained in the organic bottom anti-reflective coating composition may not be sufficiently removed, and the cross-linking reaction may not be sufficiently performed. If the heating temperature is more than 250° C., the organic bottom anti-reflective coating composition and the organic bottom anti-reflective coating may be chemically unstable. Thus, the heating temperature within the above-described range is recommended, but is not limited thereto.

Further, the present invention provides a method for forming a pattern of a semiconductor device using the organic bottom anti-reflective coating composition. Specifically, the method for forming a pattern includes 1) applying and heating an organic bottom anti-reflective coating composition of the present invention to an upper part of a substrate to form an organic bottom anti-reflective coating;

2) forming a photoresist film on the organic bottom anti-reflective coating of step 1);

3) forming a photoresist pattern by exposing and developing the substrate applied with the organic bottom anti-reflective coating and the photoresist film of step 2); and 4) etching the organic bottom anti-reflective coating using the photoresist pattern of step 3) as an etching mask, and then etching the substrate to form a pattern of the substrate.

The step of forming the organic bottom anti-reflective coating of step 1) is the same as described above.

The heating may be performed before and/or after the exposure in the step of forming the photoresist pattern in step 3), respectively, and the exposing may be performed using one or more selected from the group consisting of deep ultraviolet (DUV) including F2, ArF, KrF and EUV, electron beam, X-ray and ion beam. Further, the forming of the photoresist pattern of step 3) may be performed by developing using a conventional alkali aqueous solution such as a tetramethylammonium hydroxide (TMAH) developer, or the like, and the removing of the underlayer film of step 4) may be performed by dry etching using $CHF_3/CF_4$ mixed gas, or the like, and the etching of the substrate may be performed by plasma etching using $Cl_2$ or HBr gas. Here, the etching method, and the like, are not limited to the above-described contents, but may be variously changed depending on process conditions.

The polymers having the chemical structures represented by Chemical Formulas 1-1, 1-2, 1-3, 2-1, 2-2, 2-3, 4, and 5 of the present invention and the bottom anti-reflective coating formed by applying the bottom anti-reflective coating composition using the polymer may satisfy physical properties in which a contact angle is 60 degrees or more, a refractive index n is 1.91 to 2.0 at a wavelength of 193 nm, and an extinction coefficient k is 0.20 to 0.30. When all of the physical properties are satisfied within the above-described range, it is possible to form a good pattern shape with a high etching rate and excellent etch selectivity. In addition, it is possible to form an ultrafine pattern having excellent optical characteristics with respect to radiation having a shorter wavelength such as 157 nm, 193 nm, 248 nm, or the like, and having the good pattern shape.

Hereinafter, the present invention is described in detail on the basis of Examples and Comparative Examples. Meanwhile, the following Examples and Comparative Examples are provided by way of example for explaining the present invention in more detail, and therefore, the present invention is not limited thereto.

In Examples and Comparative Examples below, weight average molecular weights thereof were measured as follows.

Each prepared copolymer was dissolved in tetrahydrofuran, and the weight average molecular weight was measured by gel permeation chromatography (GPC).

The weight average molecular weight was measured using gel permeation chromatography (GPC) equipment from Agilent Technologies. The equipment is composed of a mobile phase pump (1260 Isocratic PumP), a column heater (1260 Thermostatted Column Compartment), a detector (1260 Infinity II RI Detector) and an injector (1260 series Autosampler). PL gel mixed C, E from Agilent Technologies was used as an analysis column, and a polystyrene standard (PS) was used as the polymaterial. HPLC grade tetrahydrofuran (THF) was used as a mobile phase solvent, and a column heater temperature was 40° C., and a flow rate for the mobile phase solvent was 1.0 mL/min. The resin prepared for the sample analysis was dissolved in mobile phase tetrahydrofuran (THF) and injected into a GPC equipment to determine the weight average molecular weight.

Preparation Example 1

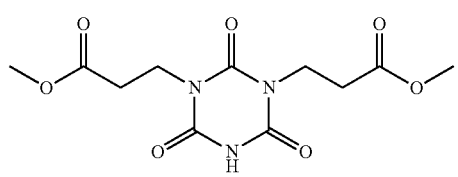

To a flask, 54 g of bis(2-carboxylethyl)cyanuric acid, 2.3 mL of sulfuric acid, and 250 mL of methanol were added, and the mixture was heated to 65° C. and stirred for 3 hours.

After completion of the reaction, the reaction mixture was cooled to 0° C. The resulting solid was filtered, washed with methanol, and dried to obtain 55 g of bis(2-carboxylethyl) cyanuric acid dimethyl ester.

Preparation Example 2

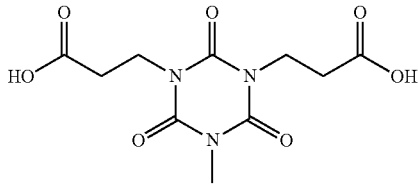 [SMILES: Cn1c(=O)n(CCC(=O)O)c(=O)n(CCC(=O)O)c1=O]

To a flask, 30 g of bis(2-carboxylethyl)cyanuric acid dimethyl ester prepared in Preparation Example 1, 18 g of calcium carbonate, 14 g of 1-iodinated methane, and 150 mL of acetonitrile were added, and the mixture was heated to 70° C. and stirred for 20 hours. After the reaction was completed, the reaction mixture was cooled to room temperature, and the organic layer was washed once with water. After concentrating the reaction solution through distillation under reduced pressure, 210 mL of 6N hydrochloric acid was added, the mixture was heated to 100° C., and stirred for 20 hours. After completion of the reaction, the reaction product was cooled to room temperature, and the resulting solid product was filtered, washed with water, and dried to obtain 22 g of methyl bis(2-carboxylethyl)cyanuric acid. HPLC analysis showed that the monomer had purity of >98%, and the final structure was confirmed by $^1$H, $^{13}$C NMR.

$^1$H NMR (500 MHz, DMSO-d6) δ 2.50 (t, J=7.0 Hz, 4H), 3.16 (s, 3H), 3.95 (t, J=8.0 Hz, 4H) ppm Preparation Example 3

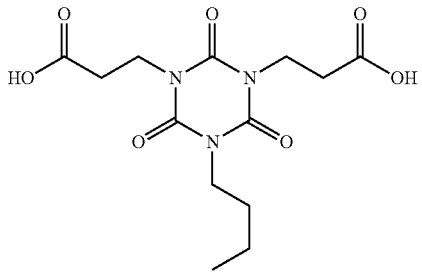 [SMILES: CCCCn1c(=O)n(CCC(=O)O)c(=O)n(CCC(=O)O)c1=O]

To a flask, 40 g of bis(2-carboxylethyl)cyanuric acid dimethyl ester prepared in Preparation Example 1, 25 g of calcium carbonate, 30 g of 1-iodobutane, and 280 mL of acetonitrile were added, and the mixture was heated to 70° C. and stirred for 20 hours. After the reaction was completed, the reaction mixture was cooled to room temperature, and the organic layer was washed once with water. After concentrating the reaction solution through distillation under reduced pressure, 210 mL of 6N hydrochloric acid was added, the mixture was heated to 100° C., and stirred for 20 hours. After completion of the reaction, the reaction product was cooled to room temperature, and the resulting solid product was filtered, washed with water, and dried to obtain 34 g of butyl bis(2-carboxylethyl)cyanuric acid. HPLC analysis showed that the monomer had purity of >98%, and the final structure was confirmed by $^1$H, $^{13}$C NMR.

$^1$H NMR (500 MHz, CDCl$_3$) δ 0.95 (t, J=7.5 Hz, 3H), 1.35-1.38 (m, 2H), 1.62 (quintet, J=7.5 Hz, 2H), 2.67 (t, J=7 Hz, 4H), 3.88 (t, J=7.5 Hz, 2H), 4.22 (t, J=7.0 Hz, 4H), 11.0 (br, 2H) ppm Preparation Example 4

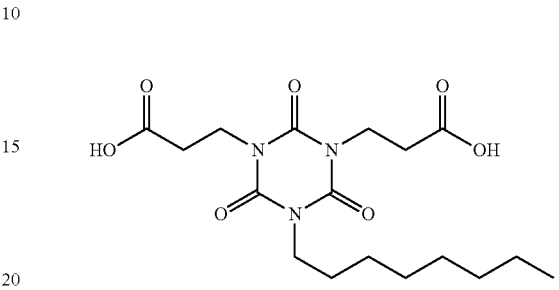

To a flask, 30 g of bis(2-carboxylethyl)cyanuric acid dimethyl ester prepared in Preparation Example 1, 18 g of calcium carbonate, 1.5 g of sodium iodide, 19 g of 1-bromooctane, and 150 mL of acetonitrile were added, and the mixture was heated to 70° C. and stirred for 20 hours. After the reaction was completed, the reaction mixture was cooled to room temperature, and the organic layer was washed once with water. After concentrating the reaction solution through distillation under reduced pressure, 210 mL of 6N hydrochloric acid was added, the mixture was heated to 100° C., and stirred for 20 hours. After completion of the reaction, the reaction product was cooled to room temperature, and the resulting solid product was filtered, washed with water, and dried to obtain 34 g of octyl bis(2-carboxylethyl)cyanuric acid. HPLC analysis showed that the monomer had purity of >98%, and the final structure was confirmed by $^1$H, $^{13}$C NMR.

$^1$H NMR (500 MHz, CDCl$_3$) δ 0.87 (t, J=7.1 Hz, 3H), 1.26-1.31 (m, 10H), 1.62 (m, 2H), 2.68 (t, J=7.5 Hz, 4H), 3.86 (t, J=7.5 Hz, 2H), 4.20 (t, J=7.0 Hz, 4H), 11.0 (br, 2H) ppm Preparation Example 5

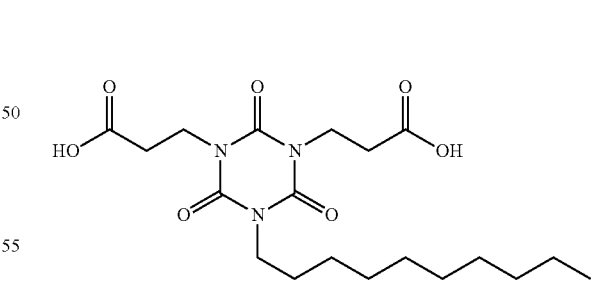

The preparation was performed in the same manner as in Preparation Example 4 except that 1-bromo decane was used instead of 1-bromooctane. HPLC analysis showed that the monomer had purity of >98%, and the final structure was confirmed by $^1$H, $^{13}$C NMR.

$^1$H NMR (500 MHz, CDCl$_3$) δ 0.846 (t, J=7.0 Hz, 3H), 1.23-1.29 (m, 14H), 1.59 (m, 2H), 2.70 (t, J=7.0 Hz, 4H), 3.83 (t, J=8.0 Hz, 2H), 4.22 (t, J=7.0 Hz, 4H), 11.34 (br, 2H) ppm Preparation Example 6

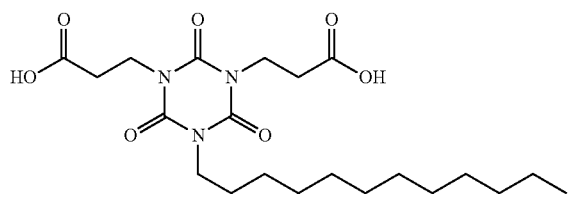 [SMILES: CCCCCCCCCCCCn1c(=O)n(CCC(=O)O)c(=O)n(CCC(=O)O)c1=O]

The preparation was performed in the same manner as in Preparation Example 4 except that 1-bromododeca was used instead of 1-bromooctane. HPLC analysis showed that the monomer had purity of >98%, and the final structure was confirmed by $^1$H, $^{13}$C NMR.

$^1$H NMR (500 MHz, CDCl$_3$) δ 0.890 (t, J=7.1 Hz, 3H), 1.27-1.33 (m, 18H), 1.63 (m, 2H), 2.71 (t, J=7.2 Hz, 4H), 3.88 (t, J=7.6 Hz, 2H), 4.22 (t, J=7.1 Hz, 4H), 11.00 (br, 2H) ppm Preparation Example 7

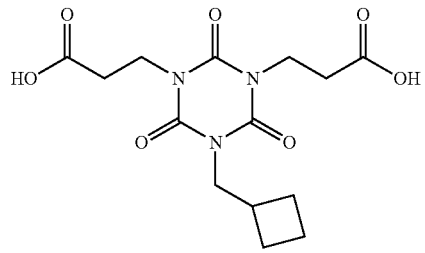 [SMILES: O=C(O)CCn1c(=O)n(CCC(=O)O)c(=O)n(CC2CCC2)c1=O]

The preparation was performed in the same manner as in Preparation Example 4 except that (bromomethyl)cyclobutane was used instead of 1-bromooctane. HPLC analysis showed that the monomer had purity of >98%, and the final structure was confirmed by $^1$H, $^{13}$C NMR.

$^1$H NMR (500 MHz, CDCl$_3$) δ 1.45 (m, 1H) 1.63-1.83 (m, 6H), 2.71 (t, J=7.2 Hz, 4H), 3.83 (m, 2H), 4.22 (t, J=7.1 Hz, 4H), 11.00 (br, 2H) ppm Preparation Example 8

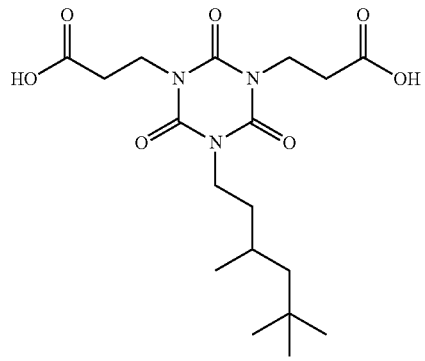 [SMILES: CC(CCn1c(=O)n(CCC(=O)O)c(=O)n(CCC(=O)O)c1=O)CC(C)(C)C]

The preparation was performed in the same manner as in Preparation Example 4 except that 1-bromo-3,5,5-triethylhexane was used instead of 1-bromooctane. HPLC analysis showed that the monomer had purity of >98%, and the final structure was confirmed by $^1$H, $^{13}$C NMR.

$^1$H NMR (500 MHz, CDCl$_3$) δ 0.88 (s, 9H), 0.98 (d, 3H), 1.08-1.12 (m, 1H), 1.26-1.29 (m, 1H) 1.53-1.62 (m, 3H), 2.68 (t, J=7.2 Hz, 4H), 3.87 (t, J=7.6 Hz, 2H), 4.20 (t, J=7.1 Hz, 4H), 10.78 (br, 2H) ppm Preparation Example 9

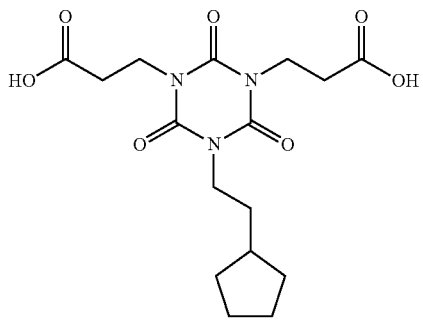 [SMILES: O=C(O)CCn1c(=O)n(CCC(=O)O)c(=O)n(CCC2CCCC2)c1=O]

The preparation was performed in the same manner as in Preparation Example 4 except that (2-bromoethyl)cyclopentane was used instead of 1-bromooctane. HPLC analysis showed that the monomer had purity of >98%, and the final structure was confirmed by $^1$H, $^{13}$C NMR.

$^1$H NMR (500 MHz, CDCl$_3$) δ 1.01-1.18 (m, 2H), 1.45-1.63 (m, 5H) 1.72-1.90 (m, 4H), 2.71 (t, J=7.2 Hz, 4H), 3.83 (m, 2H), 4.22 (t, J=7.1 Hz, 4H), 11.00 (br, 2H) ppm Preparation Example 10

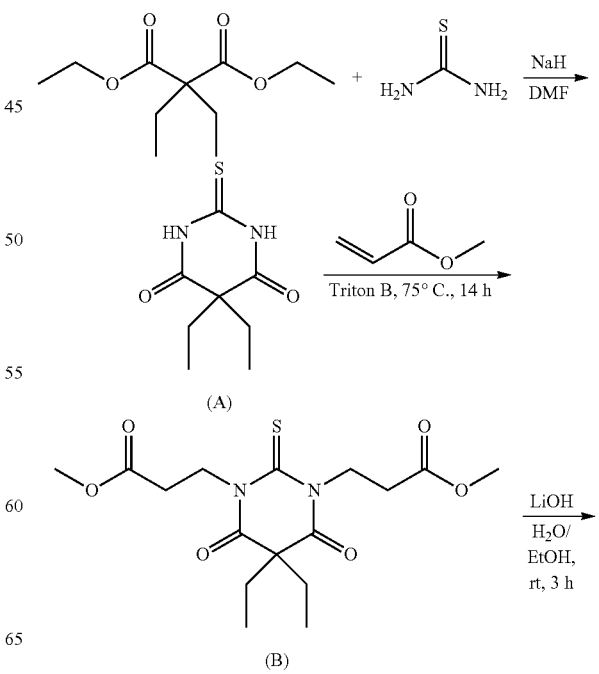

-continued

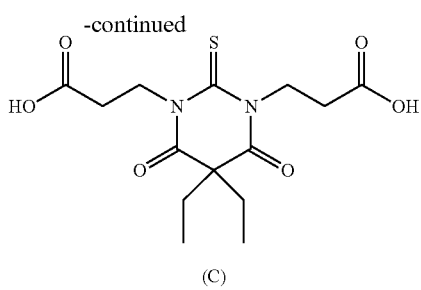

(C)

Preparation of Compound A

To a flask, 20 g of thiourea and 200 mL of dimethylformamide were added, and the mixture was cooled to 0° C. with stirring. To the reaction mixture, 26.27 g of sodium hydride (60% in mineral oil) was slowly added and stirred for 30 minutes. 59.66 g of diethyl diethylmalonate was slowly added dropwise under cooling at 0° C., and when the addition was completed, the mixture was heated to 50° C., and stirred for 24 hours. After the reaction was completed, the reaction mixture was slowly added to 200 mL of distilled water cooled to 0° C., and stirred. To the reaction product at 0° C., 450 mL of 1.0 M aqueous hydrogen chloride solution was added for neutralization and stirred for 30 minutes. The resulting solid was filtered, washed with a saturated aqueous ammonium chloride solution, processed to be reslurry using 200 mL of hexane, filtered, and dried to obtain a target compound A (white solid, 51 g).

$^1$H-NMR (500 MHz, DMSO-d6), δ 12.60 (s, 2H), 1.84 (q, 4H), 0.75 (t, 6H) ppm

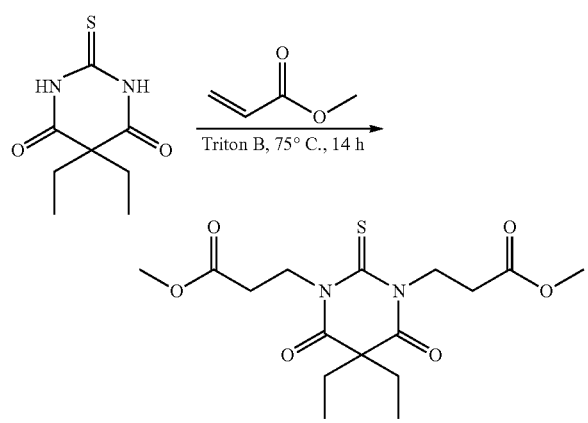

Preparation of Compound B

To a flask, 10 g of the compound A, 5.22 g of Triton B (40 wt % MeOH solution), and 100 mL of methyl acrylate were added, and the mixture was heated to 75° C. and stirred for 14 hours. After completion of the reaction, methanol and methyl acrylate were removed by distillation under reduced pressure, 100 mL of diethyl ether and 100 mL of 1.0 M aqueous sodium hydroxide solution were added and stirred for 30 minutes, and a layer was separated. The separated organic layer was washed with 100 mL of aqueous sodium chloride solution three times and recrystallized with 50 mL of hexane to obtain a compound B as a target compound (light yellow crystal, 6.0 g).

$^1$H-NMR (500 MHz, DMSO-d6), δ 4.55 (t, 4H), 3.59 (s, 6H), 2.66 (t, 4H), 1.90 (q, 4H), 0.74 (t, 6H) ppm Preparation of Compound C To a flask, 6.0 g of the compound B and 60 mL of ethanol were added, stirred, and a solution prepared by dissolving 1.16 g of lithium hydroxide in 110 mL of water was added and stirred at room temperature for 3 hours. After completion of the reaction, 50 mL of 1.0 M hydrogen chloride was added, and the mixture was stirred for 30 minutes. The resulting solid was filtered and recrystallized with acetonitrile to obtain a target compound C (white solid, 3.0 g).

$^1$H-NMR (500 MHz, DMSO-d6), δ 4.51 (t, 4H), 2.57 (t, 4H), 1.91 (q, 4H), 0.74 (t, 6H) ppm Comparative Example 1

1) Preparation of Polymer

To a flask, 8 g of triglycidyl isocyanurate, 5 g of the methyl bis(2-carboxylethyl)cyanuric acid prepared in Preparation Example 2, 0.066 g of benzyltriethylammonium chloride and 30 g of cyclohexanone were added, and the mixture was heated to 130° C. under a nitrogen atmosphere and stirred for 2 hours while refluxing. The reaction mixture was cooled to room temperature, diluted with cyclohexanone, added dropwise to heptane and isopropyl alcohol which is 6 times larger in weight, and precipitated and then vacuum dried. The obtained polymer had a weight average molecular weight of 2,300.

2) Preparation of Organic Bottom Anti-Reflective Coating Composition 3 g of the polymer obtained in Comparative Example 1, 0.3 g of tetramethoxymethyl glycoluril, and 0.03 g of para-toluenesulfonic acid were dissolved in 480 g of methyl-2-hydroxyisobutyrate and then filtered through a 0.2 μm Teflon filter to prepare an organic bottom anti-reflective coating composition 1.

Example 1

1) Preparation of Polymer 1

To a flask, 5 g of the methyl bis(2-carboxylethyl)cyanuric acid prepared in Preparation Example 2, 8 g of triglycidyl isocyanurate, 3 g of the compound obtained in Preparation Example 10, 2 g of the compound obtained in Preparation Example 10, 0.066 g of benzyltriethylammonium chloride, and 42 g of cyclohexanone were added, and the mixture was heated to 130° C. under nitrogen atmosphere and stirred for 2 hours while refluxing. The reaction mixture was cooled to room temperature, diluted with cyclohexanone, added dropwise to 6 times larger in weight heptane and isopropyl alcohol, and precipitated and then vacuum dried. The obtained polymer had a weight average molecular weight of 2,100.

2) Preparation of Organic Bottom Anti-Reflective Coating Composition 3 g of the polymer 1, 0.3 g of tetramethoxymethyl glycoluril, and 0.03 g of para-toluenesulfonic acid were dissolved in 480 g of methyl-2-hydroxyisobutyrate and then filtered through a 0.2 μm Teflon filter to prepare an organic bottom anti-reflective coating composition 2.

Example 2

1) Preparation of Polymer 2

To a flask, 5 g of the methyl bis(2-carboxylethyl)cyanuric acid prepared in Preparation Example 2, 8 g of triglycidyl isocyanurate, 3 g of succinic acid, 2 g of the compound obtained in Preparation Example 3, 0.066 g of benzyltriethylammonium chloride, and 42 g of cyclohexanone were added, and the mixture was heated to 130° C. under nitrogen atmosphere and stirred for 2 hours while refluxing. The reaction mixture was cooled to room temperature, diluted with cyclohexanone, added dropwise to 6 times larger in weight of heptane and isopropyl alcohol, precipitated and then vacuum dried. The obtained polymer had a weight average molecular weight of 2,000.

2) Preparation of Organic Bottom Anti-Reflective Coating Composition 3 g of the polymer 2, 0.3 g of tetramethoxymethyl glycoluril, and 0.03 g of para-toluenesulfonic acid were dissolved in 480 g of methyl-2-hydroxyisobutyrate and then filtered through a 0.2 μm Teflon filter to prepare an organic bottom anti-reflective coating composition 3.

Example 3

1) Preparation of Polymer 3

To a flask, 5 g of the methyl bis(2-carboxylethyl)cyanuric acid prepared in Preparation Example 2, 8 g of triglycidyl isocyanurate, 6 g of the monomer prepared in Preparation Example 5, 0.066 g of benzyltriethylammonium chloride, and 42 g of cyclohexanone were added, and the mixture was heated to 130° C. under nitrogen atmosphere and stirred for 2 hours while refluxing. The reaction mixture was cooled to room temperature, diluted with cyclohexanone, added dropwise to 6 times larger in weight of heptane and isopropyl alcohol, precipitated and then vacuum dried. The obtained polymer had a weight average molecular weight of 2,000.

2) Preparation of Organic Bottom Anti-Reflective Coating Composition 3 g of the polymer 3, 0.3 g of tetramethoxymethyl glycoluril and 0.03 g of para-toluenesulfonic acid were dissolved in 480 g of methyl-2-hydroxyisobutyrate and then filtered through a 0.2 μm Teflon filter to prepare an organic bottom anti-reflective coating composition 4.

Example 4

1) Preparation of Polymer 4

To a flask, 5 g of the methyl bis(2-carboxylethyl)cyanuric acid prepared in Preparation Example 2, 8 g of triglycidyl isocyanurate, 5 g of the octyl bis(2-carboxylethyl)cyanuric acid prepared in Preparation Example 4, 0.066 g of benzyltriethylammonium chloride, and 42 g of cyclohexanone were added, and the mixture was heated to 130° C. under nitrogen atmosphere and stirred for 2 hours while refluxing. The reaction mixture was cooled to room temperature, diluted with cyclohexanone, added dropwise to 6 times larger in weight of heptane and isopropyl alcohol, precipitated and then vacuum dried. The obtained polymer had a weight average molecular weight of 2,300.

2) Preparation of Organic Bottom Anti-Reflective Coating Composition 3 g of the polymer 4, 0.3 g of tetramethoxymethyl glycoluril, and 0.03 g of para-toluenesulfonic acid were dissolved in 480 g of methyl-2-hydroxyisobutyrate and then filtered through a 0.2 μm Teflon filter to prepare an organic bottom anti-reflective coating composition 5.

Example 5

1) Preparation of Polymer 5

To a flask, 5 g of the methyl bis(2-carboxylethyl)cyanuric acid prepared in Preparation Example 2, 8 g of triglycidyl isocyanurate, 5 g of the monomer prepared in Preparation Example 6, 0.066 g of benzyltriethylammonium chloride, and 42 g of cyclohexanone were added, and the mixture was heated to 130° C. under nitrogen atmosphere and stirred for 2 hours while refluxing. The reaction mixture was cooled to room temperature, diluted with cyclohexanone, added dropwise to 6 times larger in weight of heptane and isopropyl alcohol, precipitated and then vacuum dried. The obtained polymer had a weight average molecular weight of 2,000.

2) Preparation of Organic Bottom Anti-Reflective Coating Composition 3 g of the polymer 5, 0.3 g of tetramethoxymethyl glycoluril, and 0.03 g of para-toluenesulfonic acid were dissolved in 480 g of methyl-2-hydroxyisobutyrate and then filtered through a 0.2 μm Teflon filter to prepare an organic bottom anti-reflective coating composition 6.

Example 6

1) Preparation of Polymer 6

To a flask, 5 g of the methyl bis(2-carboxylethyl)cyanuric acid prepared in Preparation Example 2, 8 g of triglycidyl isocyanurate, 2 g of the octyl bis(2-carboxylethyl)cyanuric acid prepared in Preparation Example 4, 6 g of the monomer prepared in Preparation Example 5, 0.066 g of benzyltriethylammonium chloride, and 49 g of cyclohexanone were added, and the mixture was heated to 130° C. under nitrogen atmosphere and stirred for 2 hours while refluxing. The reaction mixture was cooled to room temperature, diluted with cyclohexanone, added dropwise to 6 times larger in weight of heptane and isopropyl alcohol, precipitated and then vacuum dried. The obtained polymer had a weight average molecular weight of 2,000.

2) Preparation of Organic Bottom Anti-Reflective Coating Composition 3 g of the polymer 6, 0.3 g of tetramethoxymethyl glycoluril, and 0.03 g of para-toluenesulfonic acid were dissolved in 480 g of methyl-2-hydroxyisobutyrate and then filtered through a 0.2 μm Teflon filter to prepare an organic bottom anti-reflective coating composition 7.

Example 7

1) Preparation of Polymer 7

To a flask, 5 g of the methyl bis(2-carboxylethyl)cyanuric acid prepared in Preparation Example 2, 8 g of triglycidyl isocyanurate, 2 g of the octyl bis(2-carboxylethyl)cyanuric acid prepared in Preparation Example 4, 3 g of the monomer prepared in Preparation Example 6, 0.066 g of benzyltriethylammonium chloride, and 42 g of cyclohexanone were added, and the mixture was heated to 130° C. under nitrogen atmosphere and stirred for 2 hours while refluxing. The reaction mixture was cooled to room temperature, diluted with cyclohexanone, added dropwise to 6 times larger in weight of heptane and isopropyl alcohol, precipitated and then vacuum dried. The obtained polymer had a weight average molecular weight of 2,100.

2) Preparation of Organic Bottom Anti-Reflective Coating Composition 3 g of the polymer 7, 0.3 g of tetramethoxymethyl glycoluril, and 0.03 g of para-toluenesulfonic acid were dissolved in 480 g of methyl-2-hydroxyisobutyrate and then filtered through a 0.2 μm Teflon filter to prepare an organic bottom anti-reflective coating composition 8.

Example 8

1) Preparation of Polymer 8

To a flask, 5 g of the methyl bis(2-carboxylethyl)cyanuric acid prepared in Preparation Example 2, 8 g of triglycidyl isocyanurate, 2 g of the octyl bis(2-carboxylethyl)cyanuric acid prepared in Preparation Example 4, 4 g of the monomer prepared in Preparation Example 7, 0.066 g of benzyltriethylammonium chloride, and 45 g of cyclohexanone were added, and the mixture was heated to 130° C. under nitrogen atmosphere and stirred for 2 hours while refluxing. The reaction mixture was cooled to room temperature, diluted with cyclohexanone, added dropwise to 6 times larger in weight of heptane and isopropyl alcohol, precipitated and then vacuum dried. The obtained polymer had a weight average molecular weight of 2,100.

2) Preparation of Organic Bottom Anti-Reflective Coating Composition 3 g of the polymer 8, 0.3 g of tetramethoxymethyl glycoluril, and 0.03 g of para-toluenesulfonic acid were dissolved in 480 g of methyl-2-hydroxyisobutyrate and then filtered through a 0.2 μm Teflon filter to prepare an organic bottom anti-reflective coating composition 9.

Example 9

1) Preparation of Polymer 9

To a flask, 5 g of the methyl bis(2-carboxylethyl)cyanuric acid prepared in Preparation Example 2, 7 g of triglycidyl isocyanurate, 2 g of the monomer prepared in Preparation Example 5, 4 g of the monomer prepared in Preparation Example 7, 0.066 g of benzyltriethylammonium chloride, and 40 g of cyclohexanone were added, and the mixture was heated to 130° C. under nitrogen atmosphere and stirred for 2 hours while refluxing. The reaction mixture was cooled to room temperature, diluted with cyclohexanone, added dropwise to 6 times larger in weight of heptane and isopropyl alcohol, precipitated and then vacuum dried. The obtained polymer had a weight average molecular weight of 2,100.

2) Preparation of Organic Bottom Anti-Reflective Coating Composition 3 g of the polymer 9, 0.3 g of tetramethoxymethyl glycoluril, and 0.03 g of para-toluenesulfonic acid were dissolved in 480 g of methyl-2-hydroxyisobutyrate and then filtered through a 0.2 μm Teflon filter to prepare an organic bottom anti-reflective coating composition 10.

Example 10

1) Preparation of Polymer 10

To a flask, 5 g of the methyl bis(2-carboxylethyl)cyanuric acid prepared in Preparation Example 2, 8 g of triglycidyl isocyanurate, 2 g of the butyl bis(2-carboxylethyl)cyanuric acid prepared in Preparation Example 3, 4 g of the monomer prepared in Preparation Example 7, 0.066 g of benzyltriethylammonium chloride, and 45 g of cyclohexanone were added, and the mixture was heated to 130° C. under nitrogen atmosphere and stirred for 2 hours while refluxing. The reaction mixture was cooled to room temperature, diluted with cyclohexanone, added dropwise to 6 times larger in weight of heptane and isopropyl alcohol, precipitated and then vacuum dried. The obtained polymer had a weight average molecular weight of 2,100.

2) Preparation of Organic Bottom Anti-Reflective Coating Composition 3 g of the polymer 10, 0.3 g of tetramethoxymethyl glycoluril, and 0.03 g of para-toluenesulfonic acid were dissolved in 480 g of methyl-2-hydroxyisobutyrate and then filtered through a 0.2 μm Teflon filter to prepare an organic bottom anti-reflective coating composition 11.

Example 11

1) Preparation of Polymer 11

To a flask, 5 g of the methyl bis(2-carboxylethyl)cyanuric acid prepared in Preparation Example 2, 8 g of triglycidyl isocyanurate, 2 g of the octyl bis(2-carboxylethyl)cyanuric acid prepared in Preparation Example 4, 5 g of the monomer prepared in Preparation Example 8, 0.066 g of benzyltriethylammonium chloride, and 46 g of cyclohexanone were added, and the mixture was heated to 130° C. under nitrogen atmosphere and stirred for 2 hours while refluxing. The reaction mixture was cooled to room temperature, diluted with cyclohexanone, added dropwise to 6 times larger in weight of heptane and isopropyl alcohol, precipitated and then vacuum dried. The obtained polymer had a weight average molecular weight of 2,300.

2) Preparation of Organic Bottom Anti-Reflective Coating Composition 3 g of the polymer 11, 0.3 g of tetramethoxymethyl glycoluril, and 0.03 g of para-toluenesulfonic acid were dissolved in 480 g of methyl-2-hydroxyisobutyrate and then filtered through a 0.2 μm Teflon filter to prepare an organic bottom anti-reflective coating composition 12.

Example 12

1) Preparation of Polymer 12

To a flask, 5 g of the methyl bis(2-carboxylethyl)cyanuric acid prepared in Preparation Example 2, 8 g of triglycidyl isocyanurate, 2.5 g of the monomer prepared in Preparation Example 5, 4 g of the monomer prepared in Preparation Example 8, 0.066 g of benzyltriethylammonium chloride, and 45 g of cyclohexanone were added, and the mixture was heated to 130° C. under nitrogen atmosphere and stirred for 2 hours while refluxing. The reaction mixture was cooled to room temperature, diluted with cyclohexanone, added dropwise to 6 times larger in weight of heptane and isopropyl alcohol, precipitated and then vacuum dried. The obtained polymer had a weight average molecular weight of 2,000.

2) Preparation of Organic Bottom Anti-Reflective Coating Composition 3 g of the polymer 12, 0.3 g of tetramethoxymethyl glycoluril, and 0.03 g of para-toluenesulfonic acid were dissolved in 480 g of methyl-2-hydroxyisobutyrate and then filtered through a 0.2 μm Teflon filter to prepare an organic bottom anti-reflective coating composition 13.

Example 13

1) Preparation of Polymer 13

To a flask, 5 g of the methyl bis(2-carboxylethyl)cyanuric acid prepared in Preparation Example 2, 8 g of triglycidyl isocyanurate, 2 g of the butyl bis(2-carboxylethyl)cyanuric acid prepared in Preparation Example 3, 3 g of the monomer prepared in Preparation Example 8, 0.066 g of benzyltriethylammonium chloride, and 45 g of cyclohexanone were added, and the mixture was heated to 130° C. under nitrogen atmosphere and stirred for 2 hours while refluxing. The reaction mixture was cooled to room temperature, diluted with cyclohexanone, added dropwise to 6 times larger in weight of heptane and isopropyl alcohol, precipitated and then vacuum dried. The obtained polymer had a weight average molecular weight of 2,100.

2) Preparation of Organic Bottom Anti-Reflective Coating Composition 3 g of the polymer 13, 0.3 g of tetramethoxymethyl glycoluril, and 0.03 g of para-toluenesulfonic acid were dissolved in 480 g of methyl-2-hydroxyisobutyrate and then filtered through a 0.2 μm Teflon filter to prepare an organic bottom anti-reflective coating composition 14.

Example 14

1) Preparation of Polymer 14

To a flask, 5 g of the methyl bis(2-carboxylethyl)cyanuric acid prepared in Preparation Example 2, 8 g of triglycidyl isocyanurate, 2 g of the octyl bis(2-carboxylethyl)cyanuric acid prepared in Preparation Example 4, 3 g of the monomer prepared in Preparation Example 9, 0.066 g of benzyltriethylammonium chloride, and 45 g of cyclohexanone were added, and the mixture was heated to 130° C. under nitrogen atmosphere and stirred for 2 hours while refluxing. The reaction mixture was cooled to room temperature, diluted with cyclohexanone, added dropwise to 6 times larger in weight of heptane and isopropyl alcohol, precipitated and then vacuum dried. The obtained polymer had a weight average molecular weight of 2,500.

2) Preparation of Organic Bottom Anti-Reflective Coating Composition 3 g of the polymer 14, 0.3 g of tetramethoxymethyl glycoluril, and 0.03 g of para-toluenesulfonic acid were dissolved in 480 g of methyl-2-hydroxyisobutyrate and then filtered through a 0.2 μm Teflon filter to prepare an organic bottom anti-reflective coating composition 15.

Example 15

1) Preparation of Polymer 15

To a flask, 5 g of the methyl bis(2-carboxylethyl)cyanuric acid prepared in Preparation Example 2, 8 g of triglycidyl isocyanurate, 3 g of the monomer prepared in Preparation Example 5, 4 g of the monomer prepared in Preparation Example 9, 0.066 g of benzyltriethylammonium chloride, and 46 g of cyclohexanone were added, and the mixture was heated to 130° C. under nitrogen atmosphere and stirred for 2 hours while refluxing. The reaction mixture was cooled to room temperature, diluted with cyclohexanone, added dropwise to 6 times larger in weight of heptane and isopropyl alcohol, precipitated and then vacuum dried. The obtained polymer had a weight average molecular weight of 2,100.

2) Preparation of Organic Bottom Anti-Reflective Coating Composition 3 g of the polymer 15, 0.3 g of tetramethoxymethyl glycoluril, and 0.03 g of para-toluenesulfonic acid were dissolved in 480 g of methyl-2-hydroxyisobutyrate and then filtered through a 0.2 μm Teflon filter to prepare an organic bottom anti-reflective coating composition 16.

Example 16

1) Preparation of Polymer 16

To a flask, 5 g of the methyl bis(2-carboxylethyl)cyanuric acid prepared in Preparation Example 2, 8 g of triglycidyl isocyanurate, 2 g of the butyl bis(2-carboxylethyl)cyanuric acid prepared in Preparation Example 3, 3.5 g of the monomer prepared in Preparation Example 9, 0.066 g of benzyltriethylammonium chloride, and 45 g of cyclohexanone were added, and the mixture was heated to 130° C. under nitrogen atmosphere and stirred for 2 hours while refluxing. The reaction mixture was cooled to room temperature, diluted with cyclohexanone, added dropwise to 6 times larger in weight of heptane and isopropyl alcohol, precipitated and then vacuum dried. The obtained polymer had a weight average molecular weight of 2,300.

2) Preparation of Organic Bottom Anti-Reflective Coating Composition 3 g of the polymer 16, 0.3 g of tetramethoxymethyl glycoluril, and 0.03 g of para-toluenesulfonic acid were dissolved in 480 g of methyl-2-hydroxyisobutyrate and then filtered through a 0.2 μm Teflon filter to prepare an organic bottom anti-reflective coating composition 17.

Example 17

1) Preparation of Polymer 17

To a flask, 3 g of the methyl bis(2-carboxylethyl)cyanuric acid prepared in Preparation Example 2, 8 g of triglycidyl isocyanurate, 2 g of the butyl bis(2-carboxylethyl)cyanuric acid prepared in Preparation Example 3, 3 g of the monomer prepared in Preparation Example 10, 2 g of succinic acid, 0.066 g of benzyltriethylammonium chloride, and 42 g of cyclohexanone were added, and the mixture was heated to 130° C. under nitrogen atmosphere and stirred for 2 hours while refluxing. The reaction mixture was cooled to room temperature, diluted with cyclohexanone, added dropwise to 6 times larger in weight of heptane and isopropyl alcohol, precipitated and then vacuum dried. The obtained polymer had a weight average molecular weight of 2,100.

2) Preparation of Organic Bottom Anti-Reflective Coating Composition 3 g of the polymer 17, 0.3 g of tetramethoxymethyl glycoluril, and 0.03 g of para-toluenesulfonic acid were dissolved in 480 g of methyl-2-hydroxyisobutyrate and then filtered through a 0.2 μm Teflon filter to prepare an organic bottom anti-reflective coating composition 18.

Example 18

1) Preparation of Polymer 18

To a flask, 8 g of triglycidyl isocyanurate, 5 g of the butyl bis(2-carboxylethyl)cyanuric acid prepared in Preparation Example 3, 3 g of the monomer prepared in Preparation Example 10, 2 g of succinic acid, 0.066 g of benzyltriethylammonium chloride, and 46 g of cyclohexanone were added, and the mixture was heated to 130° C. under a nitrogen atmosphere and stirred for 2 hours while refluxing. The reaction mixture was cooled to room temperature, diluted with cyclohexanone, added dropwise to 6 times larger in weight of heptane and isopropyl alcohol, precipitated and then vacuum dried. The obtained polymer had a weight average molecular weight of 2,200.

2) Preparation of Organic Bottom Anti-Reflective Coating Composition 3 g of the polymer 18, 0.3 g of tetramethoxymethyl glycoluril, and 0.03 g of para-toluenesulfonic acid were dissolved in 480 g of methyl-2-hydroxyisobutyrate and then filtered through a 0.2 μm Teflon filter to prepare an organic bottom anti-reflective coating composition 19.

[Stripping Test]

Composition 1 prepared in Comparative Example 1 and Compositions 2 to 19 prepared in Examples 1 to 18 were spin-coated on a silicon wafer. The film was baked at 230° C. for 60 seconds to form an anti-reflective coating. The thickness was measured, and the anti-reflective coating was deposited with a thinner solution for 60 seconds. After rotating and drying, the film thickness was measured again to compare the significant decrease or increase. The results are shown in Table 1 below.

TABLE 1

| | | Thickness before deposition (Å) | Thickness after deposition (Å) | Change in thickness (Å) |
|---|---|---|---|---|
| Comparative Example 1 | Composition 1 | 230 | 232 | +2 |
| Example 1 | Composition 2 | 229 | 228 | −1 |
| Example 2 | Composition 3 | 230 | 231 | +1 |
| Example 3 | Composition 4 | 232 | 231 | −1 |
| Example 4 | Composition 5 | 230 | 229 | −1 |
| Example 5 | Composition 6 | 230 | 231 | +1 |
| Example 6 | Composition 7 | 229 | 229 | 0 |
| Example 7 | Composition 8 | 232 | 231 | −1 |
| Example 8 | Composition 9 | 232 | 230 | −2 |
| Example 9 | Composition 10 | 231 | 232 | +1 |
| Example 10 | Composition 11 | 228 | 228 | 0 |
| Example 11 | Composition 12 | 231 | 230 | −1 |
| Example 12 | Composition 13 | 230 | 230 | 0 |
| Example 13 | Composition 14 | 231 | 229 | −2 |
| Example 14 | Composition 15 | 230 | 229 | −1 |
| Example 15 | Composition 16 | 231 | 230 | −1 |
| Example 16 | Composition 17 | 230 | 230 | 0 |
| Example 17 | Composition 18 | 229 | 230 | +1 |
| Example 18 | Composition 19 | 230 | 229 | −1 |

[Measurement of Optical Parameter]

Composition 1 prepared in Comparative Example 1 and Compositions 2 to 19 prepared in Examples 1 to 18 were spin-coated on a silicon wafer. The film was baked at 230° C. for 60 seconds to form an anti-reflective coating. The thickness was measured, and a refractive index n and an extinction coefficient k were measured at a wavelength of 193 nm using a spectroscopic ellipsometer. The measurement results are shown in Table 2 below.

TABLE 2

| | | Refractive index (n) | Extinction coefficient (k) | Thickness of anti-reflective coating (Å) |
|---|---|---|---|---|
| Comparative Example 1 | Composition 1 | 1.92 | 0.28 | 229 |
| Example 1 | Composition 2 | 1.94 | 0.26 | 230 |
| Example 2 | Composition 3 | 1.95 | 0.25 | 230 |
| Example 3 | Composition 4 | 1.97 | 0.28 | 230 |
| Example 4 | Composition 5 | 1.95 | 0.24 | 230 |
| Example 5 | Composition 6 | 1.98 | 0.29 | 230 |
| Example 6 | Composition 7 | 1.95 | 0.27 | 232 |
| Example 7 | Composition 8 | 1.99 | 0.30 | 231 |
| Example 8 | Composition 9 | 1.93 | 0.25 | 230 |
| Example 9 | Composition 10 | 1.95 | 0.26 | 229 |
| Example 10 | Composition 11 | 1.97 | 0.28 | 230 |
| Example 11 | Composition 12 | 1.96 | 0.27 | 231 |
| Example 12 | Composition 13 | 1.95 | 0.26 | 232 |
| Example 13 | Composition 14 | 1.95 | 0.28 | 230 |
| Example 14 | Composition 15 | 1.95 | 0.26 | 232 |
| Example 15 | Composition 16 | 1.95 | 0.28 | 230 |
| Example 16 | Composition 17 | 1.94 | 0.25 | 230 |
| Example 17 | Composition 18 | 1.94 | 0.23 | 230 |
| Example 18 | Composition 19 | 1.95 | 0.27 | 230 |

[Measurement of Contact Angle]

Composition 1 prepared in Comparative Example 1 and Compositions 2 to 19 prepared in Examples 1 to 18 were spin-coated on a silicon wafer. The film was baked at 230° C. for 60 seconds to form an anti-reflective coating. The thickness was measured, and then the contact angle was measured. The measurement results are shown in Table 3 below. The contact angle was measured using a KRUSS DSA100 instrument. Water was dropped on a wafer coated with the anti-reflective coating, and the angle of the water droplet was measured using the instrument.

TABLE 3

| | | Contact Angle (°) | Thickness of anti-reflective coating (Å) |
|---|---|---|---|
| Comparative Example 1 | Composition 1 | 57 | 230 |
| Example 1 | Composition 2 | 60 | 229 |
| Example 2 | Composition 3 | 63 | 230 |
| Example 3 | Composition 4 | 67 | 230 |
| Example 4 | Composition 5 | 65 | 230 |
| Example 5 | Composition 6 | 68 | 231 |
| Example 6 | Composition 7 | 70 | 230 |
| Example 7 | Composition 8 | 71 | 233 |
| Example 8 | Composition 9 | 69 | 232 |
| Example 9 | Composition 10 | 70 | 230 |
| Example 10 | Composition 11 | 66 | 229 |
| Example 11 | Composition 12 | 68 | 230 |
| Example 12 | Composition 13 | 71 | 231 |
| Example 13 | Composition 14 | 65 | 230 |
| Example 14 | Composition 15 | 69 | 230 |
| Example 15 | Composition 16 | 70 | 231 |
| Example 16 | Composition 17 | 68 | 230 |
| Example 17 | Composition 18 | 70 | 229 |
| Example 18 | Composition 19 | 72 | 230 |

[Measurement of Etching Rate]

Composition 1 prepared in Comparative Example 1 and Compositions 2 to 19 prepared in Examples 1 to 18 were spin-coated on a silicon wafer. Here, the spin-coating was performed at the spin-rate adjusted to about 1200 Å, and the thickness was then measured. Then, after dry etching for 20 seconds, the thickness was measured again. The etching rate was calculated using the thicknesses before and after etching. The measurement results are shown in Table 4 below.

TABLE 4

| | | Thickness before etching (Å) | Thickness after etching (Å) | Etching rate (Å/sec) |
|---|---|---|---|---|
| Comparative Example 1 | Composition 1 | 1200 | 860 | 17.0 |
| Example 1 | Composition 2 | 1250 | 900 | 17.5 |
| Example 2 | Composition 3 | 1200 | 850 | 17.5 |
| Example 3 | Composition 4 | 1220 | 810 | 20.5 |
| Example 4 | Composition 5 | 1205 | 759 | 22.3 |
| Example 5 | Composition 6 | 1200 | 790 | 20.5 |
| Example 6 | Composition 7 | 1240 | 828 | 20.6 |
| Example 7 | Composition 8 | 1205 | 803 | 20.1 |
| Example 8 | Composition 9 | 1195 | 798 | 19.9 |
| Example 9 | Composition 10 | 1202 | 805 | 19.9 |
| Example 10 | Composition 11 | 1199 | 793 | 20.3 |
| Example 11 | Composition 12 | 1200 | 800 | 20.0 |
| Example 12 | Composition 13 | 1210 | 815 | 19.8 |
| Example 13 | Composition 14 | 1197 | 803 | 19.7 |
| Example 14 | Composition 15 | 1210 | 801 | 20.5 |
| Example 15 | Composition 16 | 1180 | 800 | 19.0 |
| Example 16 | Composition 17 | 1200 | 820 | 19.0 |
| Example 17 | Composition 18 | 1190 | 820 | 18.5 |
| Example 18 | Composition 19 | 1230 | 870 | 18.0 |

[Formation and Evaluation of Resist Pattern]

Composition 1 prepared in Comparative Example 1 and Compositions 2 to 19 prepared in Examples 1 to 18 were spin-coated on a silicon wafer. The film was baked at 230° C. for 60 seconds to form an organic anti-reflective coating. ArF (193 nm) photoresist was applied to an upper part of the anti-reflective coating, and baked at 110° C. for 90 seconds. The product was baked, exposed using scanner equipment, and baked again at 110° C. for 90 seconds. The exposed wafer was developed using a developer of 2.38 wt % TMAH to obtain a final 40 nm Line&Space photoresist pattern. The pattern shape was visually confirmed by observing undercut phenomenon and footing phenomenon, and the like. Energy margin and process margin were evaluated together. The measurement results are shown in Table 5 below.

Figure 2:
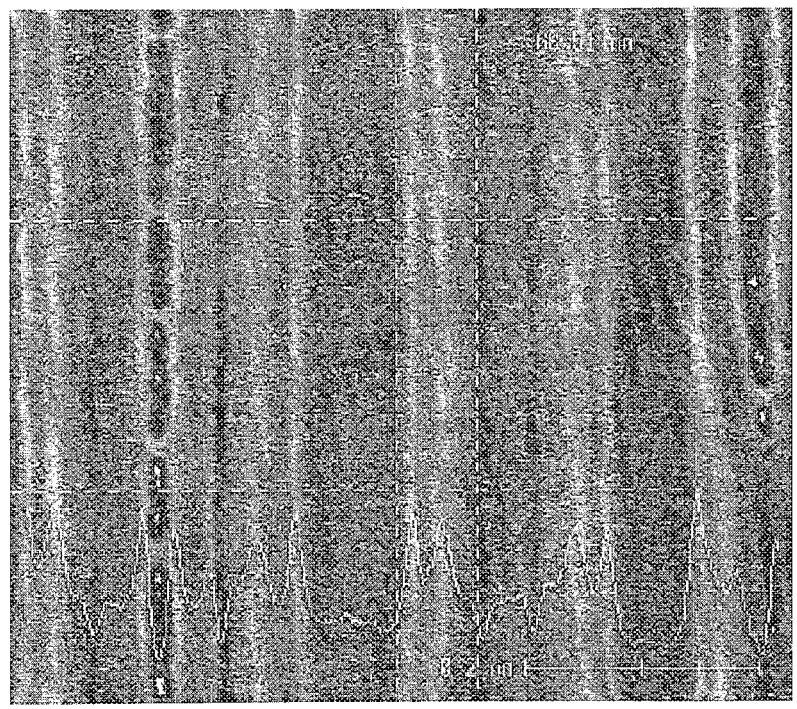
FIG. 2 shows a resist pattern formed by using a composition 1.

FIG. 1 shows a good resist pattern formed by using the composition 10 and FIG. 2 shows a resist pattern formed by using the composition 1.

TABLE 5

|  |  | Pattern Size (nm) | Pattern shape | Energy margin (%) | Focus margin (μm) |
|---|---|---|---|---|---|
| Comparative Example 1 | Composition 1 | 40 | Collapse | — | — |
| Example 1 | Composition 2 | 40 | Good | 9.1 | 0.20 |
| Example 2 | Composition 3 | 40 | Good | 9.2 | 0.23 |
| Example 3 | Composition 4 | 40 | Good | 9.8 | 0.27 |
| Example 4 | Composition 5 | 40 | Good | 10.0 | 0.30 |
| Example 5 | Composition 6 | 40 | Good | 11.0 | 0.27 |
| Example 6 | Composition 7 | 40 | Good | 9.9 | 0.33 |
| Example 7 | Composition 8 | 40 | Good | 10.2 | 0.30 |
| Example 8 | Composition 9 | 40 | Good | 10.5 | 0.30 |
| Example 9 | Composition 10 | 40 | Good | 11.1 | 0.30 |
| Example 10 | Composition 11 | 40 | Good | 10.1 | 0.33 |
| Example 11 | Composition 12 | 40 | Good | 9.9 | 0.30 |
| Example 12 | Composition 13 | 40 | Good | 10.0 | 0.27 |
| Example 13 | Composition 14 | 40 | Good | 11.0 | 0.30 |
| Example 14 | Composition 15 | 40 | Good | 10.1 | 0.30 |
| Example 15 | Composition 16 | 40 | Good | 10.9 | 0.27 |
| Example 16 | Composition 17 | 40 | Good | 10.0 | 0.30 |
| Example 17 | Composition 18 | 40 | Good | 10.1 | 0.27 |
| Example 18 | Composition 19 | 40 | Good | 10.0 | 0.30 |

The invention claimed is:

1. A polymer for an organic bottom anti-reflective coating comprising:
   one or more chemical structures selected from Chemical Formulas 1-1, 1-2, and 1-3 below and one or more chemical structures selected from Chemical Formulas 2-1, 2-2, and 2-3 below:

[Chemical Formula 1-1]

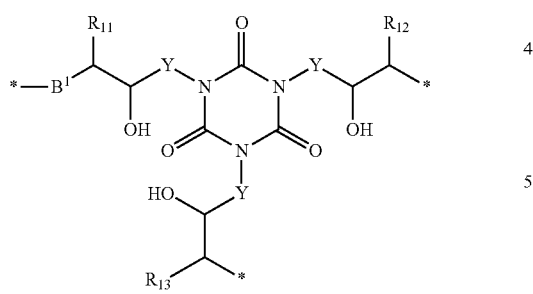

[Chemical Formula 1-2]

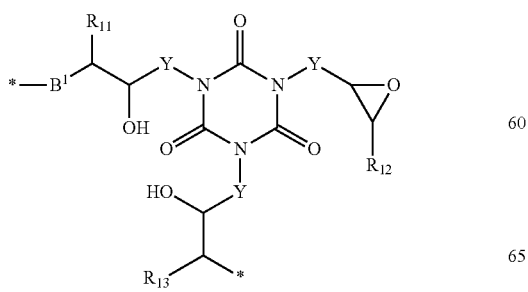

[Chemical Formula 1-3]

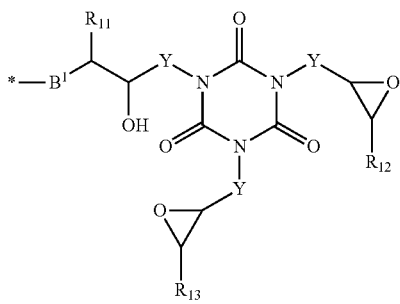

[Chemical Formula 2-1]

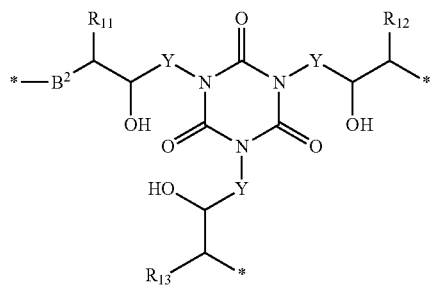

[Chemical Formula 2-2]

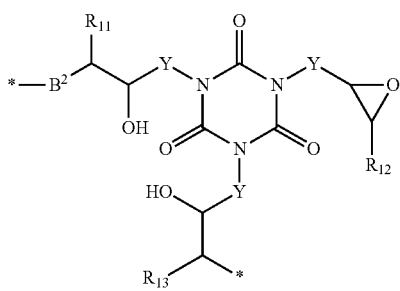

[Chemical Formula 2-3]

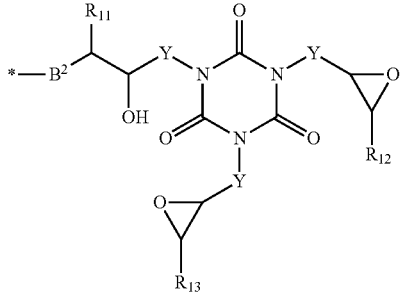

in Chemical Formulas 1-1, 1-2, 1-3, 2-1, 2-2, and 2-3, Y is a divalent linking group, and $R_{11}$, $R_{12}$, and $R_{13}$ are each selected from hydrogen and C1-C10 alkyl, and each of $B^1$ and $B^2$ is selected from Chemical Formula 3 below and has a different chemical structure,

[Chemical Formula 3]

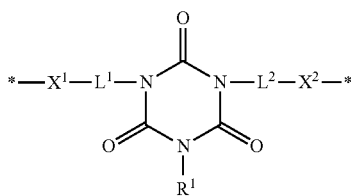

in Chemical Formula 3, $R^1$ is selected from hydrogen, C1-C40 hydrocarbyl, substituted C1-C40 hydrocarbyl, C1-C40 heterohydrocarbyl, and substituted C1-C40 heterohydrocarbyl, $X^1$ and $X^2$ are each independently selected from —O—, —COO—, —NR—, and —S—, and R is selected from hydrogen and C1-C10 alkyl, and $L^1$ and $L^2$ are each independently selected from C1-C10 alkylene, C2-C15 alkenylene, C3-C10 cycloalkylene, and C6-C20 arylene.

2. The polymer for an organic bottom anti-reflective coating of claim 1, further comprising:
any one or two or more chemical structures selected from Chemical Formulas 4 and 5 below:

[Chemical Formula 4]

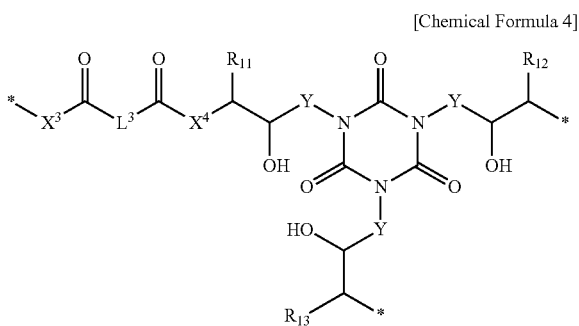

in Chemical Formula 4, Y is a divalent linking group, $R_{11}$, $R_{12}$, and $R_{13}$ are each selected from hydrogen and C1-C10 alkyl, $X^3$ and $X^4$ are each independently selected from —O—, —COO—, —NR—, and —S—, and R is selected from hydrogen and C1-C10 alkyl, and $L^3$ is selected from a direct bond, C1-C40 hydrocarbylene, and C1-C40 heterohydrocarbylene,

[Chemical Formula 5]

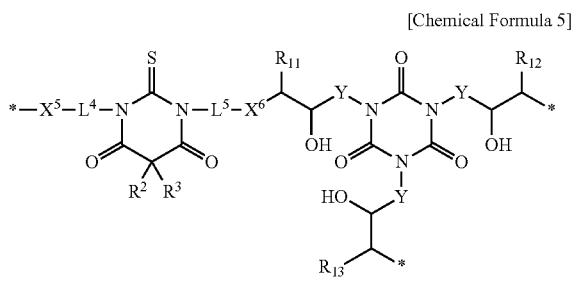

in Chemical Formula 5, Y is a divalent linking group, $R_{11}$, $R_{12}$, and $R_{13}$ are each selected from hydrogen and C1-C10 alkyl, $R^2$ and $R^3$ are each independently selected from hydrogen, halogen, nitro, cyano, hydroxy, C1-C40 hydrocarbyl, substituted C1-C40 hydrocarbyl, C1-C40 heterohydrocarbyl, and substituted C1-C40 heterohydrocarbyl, or $R^2$ and $R^3$ may be an alicyclic ring linked via C1-C40 hydrocarbylene with or without a hetero atom, $X^5$ and $X^6$ are each independently selected from —O—, —COO—, —NR—, and —S—, and R is selected from hydrogen and C1-C10 alkyl, and $L^4$ and $L^5$ are each independently selected from C1-C10 alkylene, C2-C15 alkenylene, C3-C10 cycloalkylene, and C6-C20 arylene.

3. The polymer for an organic bottom anti-reflective coating of claim 1, wherein the polymer has a weight average molecular weight of 1,000 to 30,000 g/mol.

4. The polymer for an organic bottom anti-reflective coating of claim 1, wherein in Chemical Formulas 1-1, 1-2, 1-3, 2-1, 2-2, and 2-3 above, Y is C1-C10 alkylene, $R_{11}$, $R_{12}$, and $R_{13}$ are hydrogen,
each of $B^1$ and $B^2$ is selected from Chemical Formula 3 above and has a different chemical structure,
in Chemical Formula 3 above, $R^1$ is C1-C20 alkyl or C3-C10 cycloalkyl C1-C10 alkyl,
$X^1$ and $X^2$ are each independently —COO—, and
$L^1$ and $L^2$ are each independently C1-C10 alkylene.

5. The polymer for an organic bottom anti-reflective coating of claim 4, wherein $B^1$ is a chemical structure in which $R^1$ in Chemical Formula 3 is C1-C4 alkyl, and $B^2$ is a chemical structure in which $R^1$ in Chemical Formula 3 is C6-C14 alkyl or C3-C5 cycloalkyl C1-C10 alkyl.

6. The polymer for an organic bottom anti-reflective coating of claim 2, wherein in Chemical Formula 4, Y is C1-C10 alkylene, $R_{11}$, $R_{12}$ and $R_{13}$ are hydrogen, $X^3$ and $X^4$ are —COO—, and $L^3$ is C1-C10 alkylene,
in Chemical Formula 5, Y is C1-C10 alkylene, $R_{11}$, $R_{12}$ and $R_{13}$ are hydrogen, $R^2$ and $R^3$ are each independently C1-C15 alkyl, $X^5$ and $X^6$ are —COO—, $L^4$ and $L^5$ are each independently C1-C10 alkylene.

7. A bottom anti-reflective coating composition comprising:
the polymer for an organic bottom anti-reflective coating of claim 1.

8. The bottom anti-reflective coating composition of claim 7, wherein the bottom anti-reflective coating composition includes 1 to 50 wt % of the polymer and 50 to 99 wt % of an organic solvent.

9. The bottom anti-reflective coating composition of claim 8, further comprising:
any one or two or more additive(s) selected from an acid, an acid generator, a cross-linking agent, a defoaming agent, a light absorber, a curing agent and a surfactant.

10. A bottom anti-reflective coating formed by applying the bottom anti-reflective coating composition of claim 7 and having a contact angle of 60 degrees or more, a refractive index n of 1.91 to 2.0 at a wavelength of 193 nm, and an extinction coefficient k of 0.20 to 0.30.

* * * * *